United States Patent
Yaegashi

(10) Patent No.: US 6,995,414 B2
(45) Date of Patent: Feb. 7, 2006

(54) SEMICONDUCTOR MEMORY DEVICE INCLUDING MULTI-LAYER GATE STRUCTURE

(75) Inventor: Toshitake Yaegashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 10/294,049

(22) Filed: Nov. 14, 2002

(65) Prior Publication Data

US 2003/0094635 A1 May 22, 2003

(30) Foreign Application Priority Data

Nov. 16, 2001 (JP) .................................. 2001-352020
May 30, 2002 (JP) .................................. 2002-156982

(51) Int. Cl.
*H01L 27/108* (2006.01)
*H01L 29/76* (2006.01)
*H01L 29/94* (2006.01)
*H01L 31/119* (2006.01)

(52) U.S. Cl. ........................................ 257/296; 257/314
(58) Field of Classification Search ................. 257/296, 257/314, 315, 316, 317, 318, 319, 320, 321
See application file for complete search history.

(56) References Cited

U.S. PATENT DOCUMENTS 6,002,605 A    12/1999 Iwasaki et al.
6,248,629 B1    6/2001 Liu et al.
6,281,131 B1 *  8/2001 Gilton et al. ............... 438/705

FOREIGN PATENT DOCUMENTS

| | | |
|---|---|---|
| JP | 62-150768 | 7/1987 |
| JP | 2-299271 | 12/1990 |
| JP | 3-76126 | 4/1991 |
| JP | 08-250722 | 3/1995 |
| JP | 8-130309 | 5/1996 |
| JP | 11-67937 | 3/1999 |
| JP | 2001-217329 | 8/2001 |
| JP | 2001-274365 | 10/2001 |
| JP | 2002-57230 | 2/2002 |
| KR | 10-1998-0053149 | 5/2000 |
| KR | 10-1997-0077467 | 9/2004 |

* cited by examiner

*Primary Examiner*—Hoai Pham
(74) *Attorney, Agent, or Firm*—Frommer Lawrence & Haug LLP

(57) ABSTRACT

A semiconductor memory device includes a first select transistor, first stepped portion, and a first contact plug. The first select transistor is formed on a side of an upper surface of a substrate and has a first multi-layer gate. The first stepped portion is formed by etching the substrate adjacent to the first multi-layer gate of the first select transistor such that the first stepped portion forms a cavity in the upper surface of the substrate. The first contact plug is formed in the first stepped portion.

14 Claims, 20 Drawing Sheets

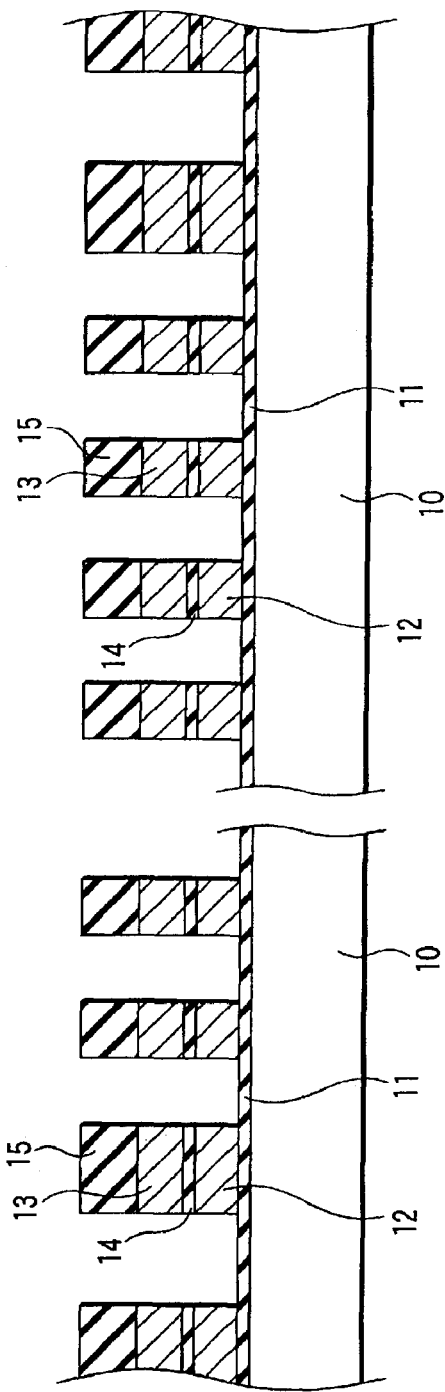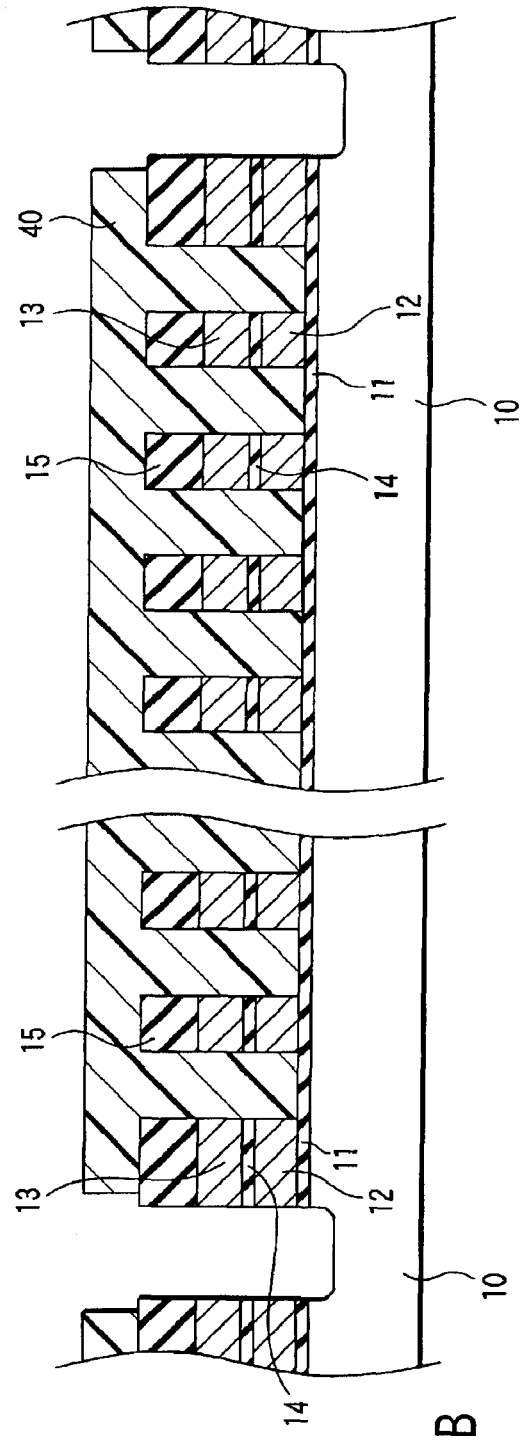
FIG. 3A
FIG. 3B

Memory cell array

Peripheral region

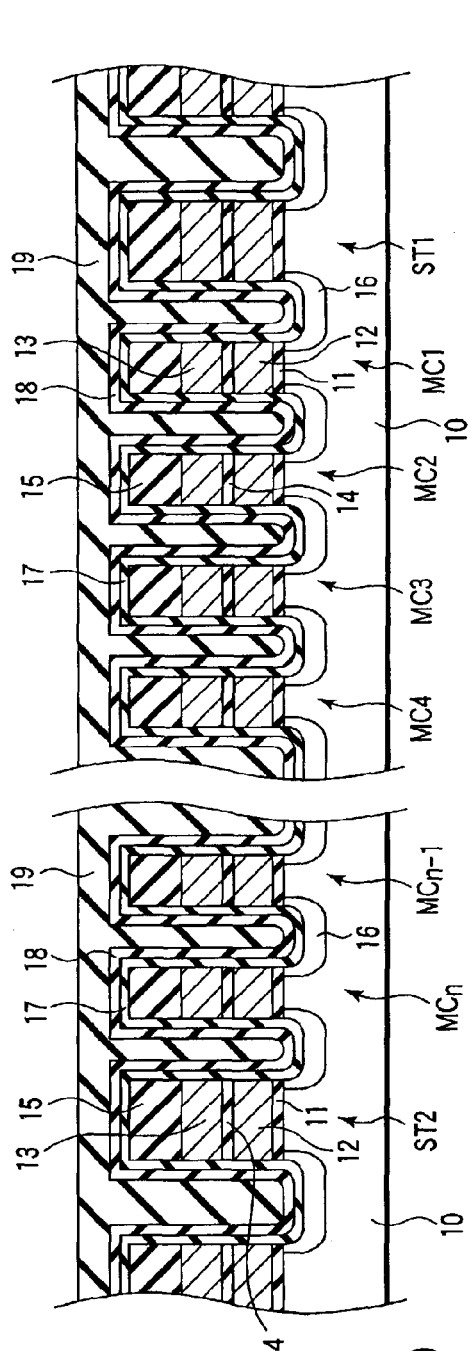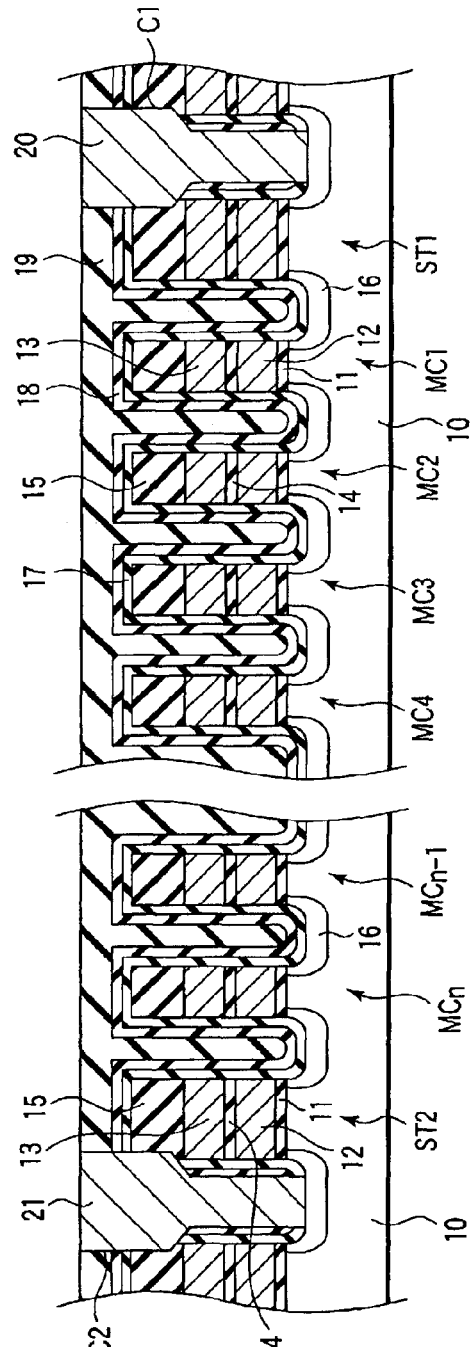
F I G. 6D
F I G. 6E

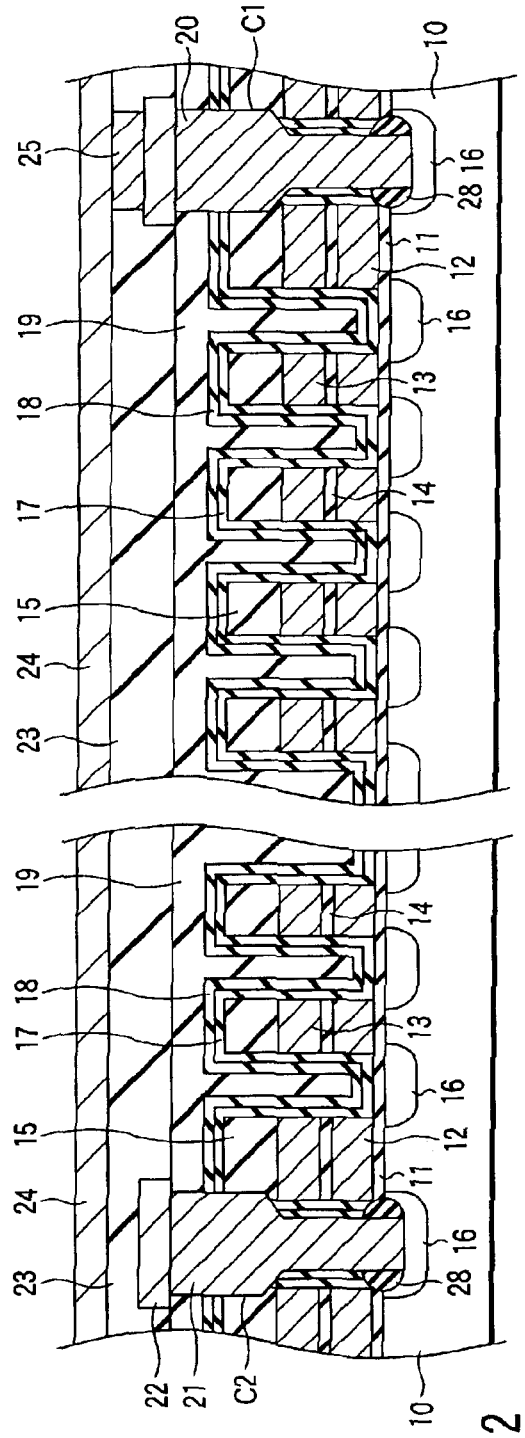
F I G. 12
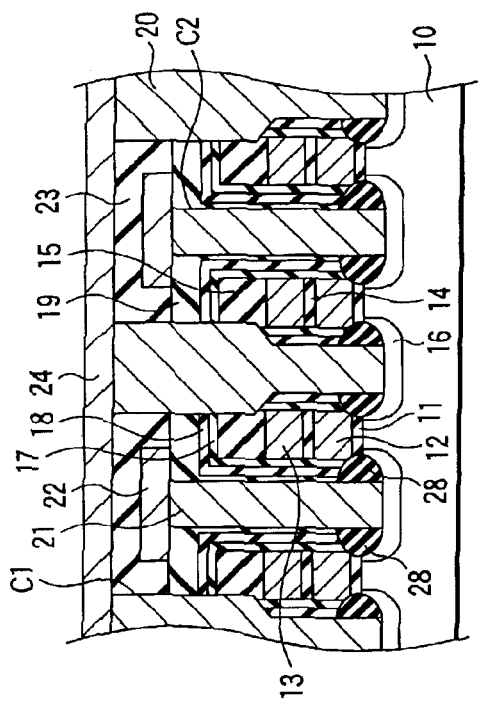
F I G. 13

SEMICONDUCTOR MEMORY DEVICE INCLUDING MULTI-LAYER GATE STRUCTURE

CROSS-REFERENCE TO RELATED APPLICATIONS

This application is based upon and claims the benefit of priority from the prior Japanese Patent Applications No. 2001-352020, filed Nov. 16, 2001; and No. 2002-156982, filed May 30, 2002, the entire contents of both of which are incorporated herein by reference.

BACKGROUND OF THE INVENTION

1. Field of the Invention

The present invention relates to a semiconductor memory apparatus, particularly to a semiconductor integrated circuit apparatus including a nonvolatile memory cell transistor and select transistor. Moreover, the apparatus is used, for example, in a semiconductor memory or memory embedded device which includes a NAND type memory array.

2. Description of the Related Art

In recent years, an electrically erasable and programmable read only memory (EEPROM) which is electrically writable/erasable has remarkably spread. A conventional structure of EEPROM will be described with reference to FIG. 1. FIG. 1 is a sectional view along a bit line direction in a memory cell array region of a NAND type flash memory.

As shown, two select transistors ST1, ST2 and n memory cell transistors MC1 to MCn connected in series between the select transistors are formed in a memory cell array. Each of the transistors ST1, ST2, MC1 to MCn includes a multi-layer gate formed on a silicon substrate 100 with a gate insulating film (tunnel insulating film) 110 interposed therebetween. The gate insulating film 110 is thin to such an extent that a tunnel current can flow. The multi-layer gate includes: a charge accumulation layer 120 electrically separated for each memory cell; a control gate 130; a inter-gate insulating film 140 formed between the charge accumulation layer 120 and control gate 130; and a gate cap film 150 disposed on the control gate 130. In the silicon substrate 100 on both sides of the multi-layer gate, n-type impurity diffusion layers 160 having a conductive type opposite to a type of the silicon substrate 100 in which a channel region is formed are formed. The impurity diffusion layer 160 functions as a source, drain region. The selection and memory cell transistors are formed including the multi-layer gate and impurity diffusion layer 160. Moreover, two select transistors ST1, ST2 and n memory cell transistors MC1 to MCn constituted as described above are connected in series and disposed so that the impurity diffusion layer 160 is shared.

An insulating film 170 is formed on the multi-layer gate, and a contact barrier film 180 is formed on the insulating film 170. Moreover, an interlayer insulating film 190 is formed on the contact barrier film 180. Further in the interlayer insulating film 190, a bit line contact plug 200 and common source line contact plug 210 are formed to reach the drain and source regions of the select transistors ST1, ST2. Additionally, a metal wiring layer 220 is formed on the interlayer insulating film 190. A part of the metal wiring layer 220 is connected to the common source line contact plug 210, and functions as a common source line. Furthermore, an interlayer insulating film 230 is formed on the interlayer insulating film 190, and a metal wiring layer 240 is formed on the interlayer insulating film 230. The metal wiring layer 240 is connected to the bit line contact plug 200 via a contact plug 250, and functions as a bit line. Additionally, the charge accumulation layer 120 and control gate 130 of the select transistor are electrically connected in a region (not shown).

In the flash memory constituted as described above, the charge accumulation layer and semiconductor substrate transmit/receive electric charges with each other via the gate insulating film, so that data is rewritten.

However, in the conventional semiconductor memory device, when the number of rewritings of data increases, the electric charge is trapped in the gate insulating film. Then, the data is reversed by de-trapping the trapped electric charge, and reliability of the memory cell is deteriorated. Particularly, in the flash memory of a type such that the semiconductor substrate is positively biased with respect to the charge accumulation layer and thereby the data is rewritten, this tendency is remarkable. In this type of flash memory, electrons are discharged from the charge accumulation layer using Fowler Nordheim (FN) tunnel current. As a result, the data is rewritten. In this case, an electric field is concentrated particularly in an edge of the charge accumulation layer. Therefore, as compared with the gate insulating film on a channel region, in the gate insulating film in the vicinity of the charge accumulation layer edge, electron trap easily occurs. Furthermore, when a gate length shortens with miniaturization of a semiconductor apparatus, there is a tendency of an increase of an influence in the vicinity of the charge accumulation layer edge with respect to the channel region. As a result, the deterioration of reliability of the memory cell becomes more remarkable.

Moreover, as shown in FIG. 1, the bit line contact plug 200 and common source line contact plug 210 are formed in a self-aligning manner with respect to the gate electrodes of the select transistors ST1, ST2. In this case, short circuit tends to easily occur between the gate electrode 120 and bit line contact plug 200 of the select transistor ST1, or between the gate electrode 120 and common source line contact plug 210 of the select transistor ST2.

BRIEF SUMMARY OF THE INVENTION

A semiconductor memory device according to a first aspect of the present invention comprises:

a first select transistor formed on a side of an upper surface of a substrate and having a first multi-layer gate;

a first stepped portion formed by etching the substrate adjacent to the first multi-layer gate of the first select transistor such that the first stepped portion forms a cavity in the upper surface of the substrate; and a first contact plug formed in the first stepped portion.

A memory card according to a second aspect of the present invention comprises:

the semiconductor memory device according to the first aspect of the present invention.

A card holder according to a third aspect of the present invention inserts the memory card according to the second aspect of the present invention therein.

A connecting device according to a fourth aspect of the present invention inserts the memory card according to the second aspect of the present invention therein.

A device for storing information according to a fifth aspect of the present invention comprises:

a memory card which includes a semiconductor memory, the semiconductor memory including: a select transistor formed on a side of an upper surface of a substrate and having a multi-layer gate, a stepped portion formed by etching the substrate adjacent to the multi-layer gate of the select transistor such that the stepped portion forms a cavity in the upper surface of the substrate and a contact plug formed in the stepped portion.

A system for accessing a storage medium according to a sixth aspect of the present invention comprises:

a memory card which includes a semiconductor memory, the semiconductor memory including: a select transistor formed on a side of an upper surface of a substrate and having a multi-layer gate, a stepped portion formed by etching the substrate adjacent to the multi-layer gate of the select transistor such that the stepped portion forms a cavity in the upper surface of the substrate and a contact plug formed in the stepped portion.

An apparatus for storing information according to a seventh aspect of the present invention comprises:

memory means incorporated within the memory card for storing information; the memory means including a select transistor being formed on a side of an upper surface of a substrate and having a multi-layer gate, a stepped portion formed by etching the substrate adjacent to the multi-layer gate of the select transistor such that the stepped portion forms a cavity in the upper surface of the substrate and a contact plug formed in the stepped portion;

input means for inputting information to be stored in the memory means; and memory reading means for reading information stored in the memory means of the memory card.

BRIEF DESCRIPTION OF THE SEVERAL VIEWS OF THE DRAWING

FIGS. 3A to 3C are sectional views successively showing manufacturing steps of the semiconductor memory device according to the first embodiment of the present invention;

FIG. 3D is an enlarged view of a partial region of FIG. 3C;

FIGS. 6D and 6E are sectional views successively showing the manufacturing steps of the semiconductor memory device according to the third embodiment of the present invention;

FIG. 12 is a sectional view of the semiconductor memory device according to a seventh embodiment of the present invention; and FIG. 13 is a sectional view of the semiconductor memory device according to an eighth embodiment of the present invention.

DETAILED DESCRIPTION OF THE INVENTION

<First Embodiment>

Figure 1:
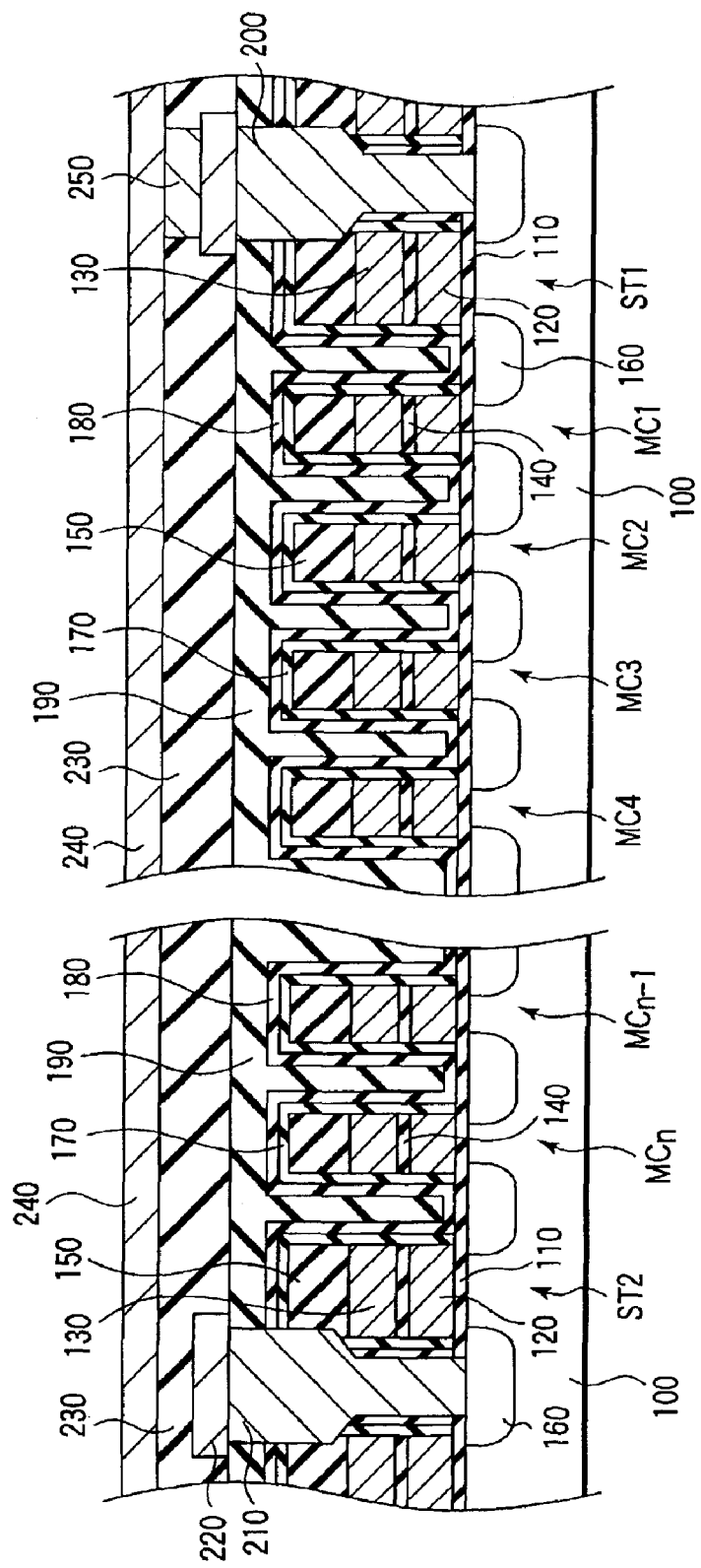
FIG. 1 is a sectional view of a conventional NAND type flash memory.
Figure 2A:
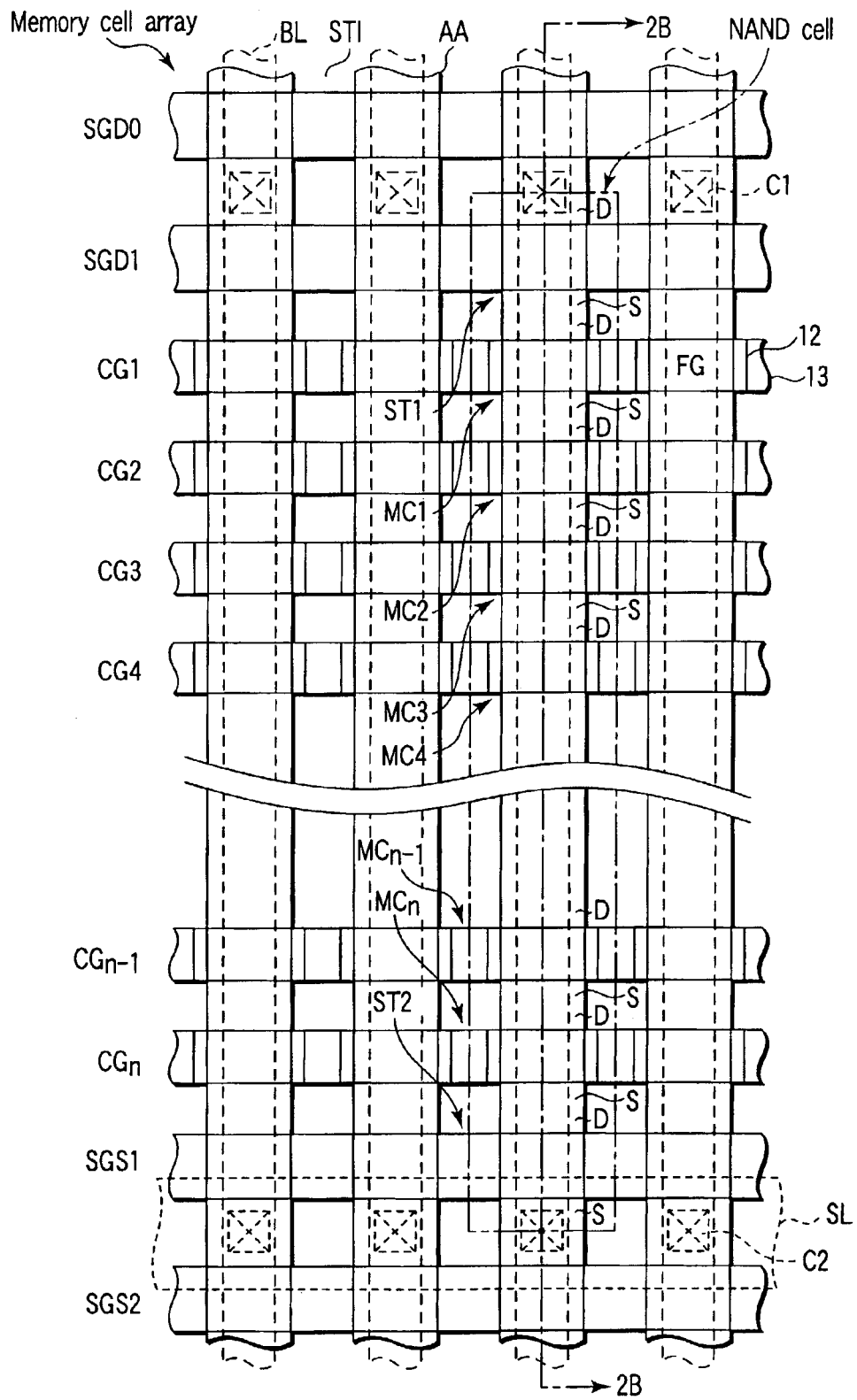
FIG. 2A is a plan view of a semiconductor memory device according to a first embodiment of the present invention.
Figure 2B:
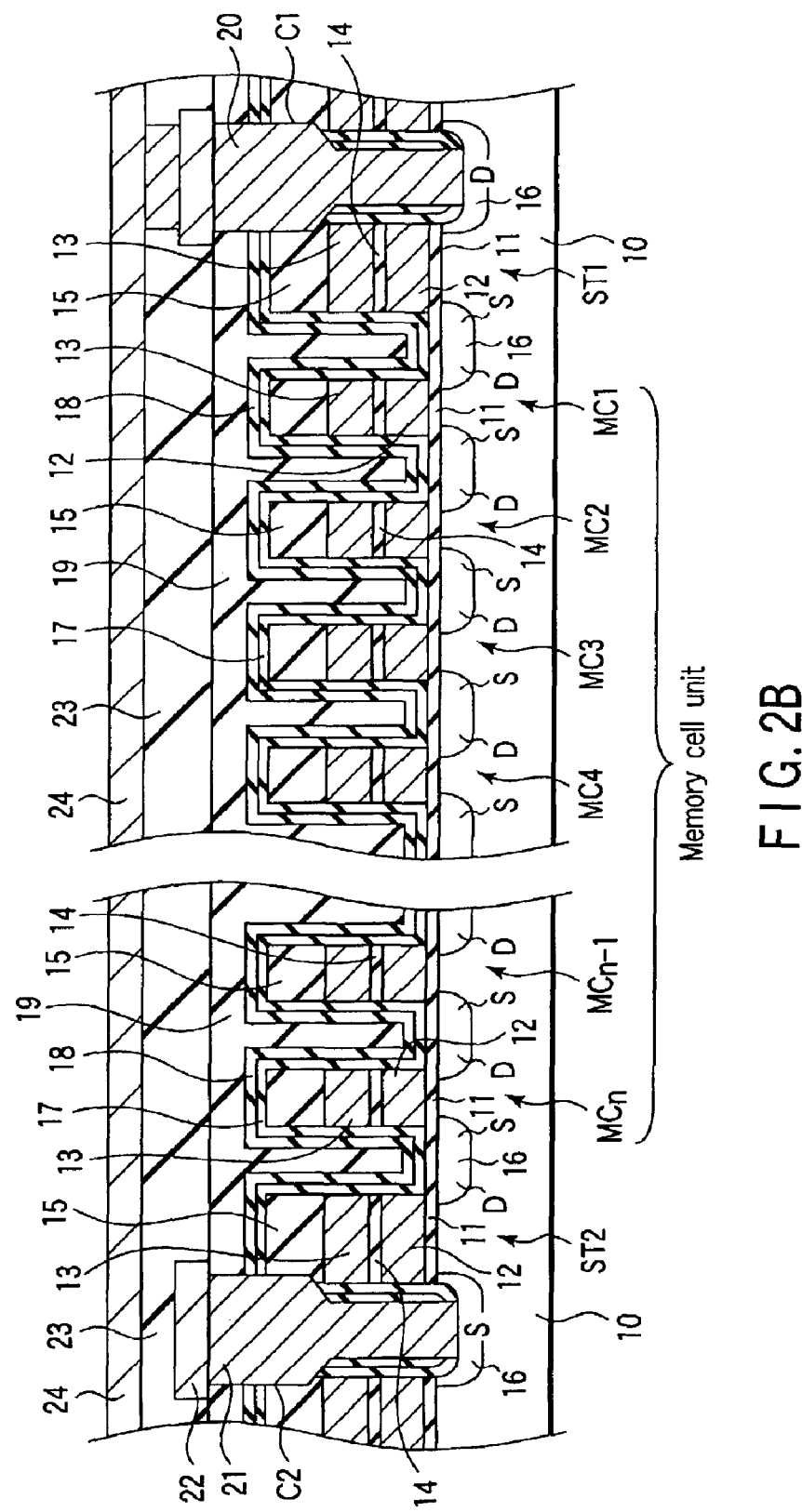
FIG. 2B is a sectional view along a line 2B—2B in FIG. 2A.

A semiconductor memory device according to a first embodiment of the present invention will be described with reference to FIGS. 2A and 2B. FIG. 2A is a plan view of a NAND type flash memory according to the first embodiment, and FIG. 2B is a sectional view taken along a line 2B—2B in FIG. 2A.

As shown, a plurality of element isolating regions STI is formed in a strip form in a p type silicon substrate (or p-type well region) 10. Each element isolating region STI includes a trench disposed in the silicon substrate 10, and an insulating film such as a silicon oxide film ($SiO_2$) by which the trench is buried. Moreover, a region between the element isolating regions STI disposed adjacent to each other forms a element region AA in which a semiconductor device is to be formed. A thin gate insulating film (tunnel insulating film) 11 through which a tunnel current can flow is formed on the whole surface of the element region AA.

A plurality of NAND cells is formed in the element region AA. Each of the NAND cells includes two select transistors ST1, ST2 and n memory cell transistors MC1 to MCn having current paths (source/drain) connected in series between the select transistors. Each of the transistors ST1, ST2, MC1 to MCn includes a multi-layer gate disposed on the silicon substrate 10 with the gate insulating film 11 interposed therebetween.

The multi-layer gate is formed as follows. That is, a charge accumulation layer (FG) 12 separated for each memory cell is formed on the gate insulating film 11, and a control gate 13 is formed on the charge accumulation layer 12 with a inter-gate insulating film 14 interposed therebetween. Furthermore, a gate cap film 15 is formed on the control gate 13, so that the multi-layer gate is formed. For example, a polycrystal silicon film is used to form the charge accumulation layer 12 and control gate 13, a silicon oxide film ($SiO_2$) is used to form the gate insulating film 11, a multilayered structure of the silicon oxide film and a silicon nitride film (ON, NO, ONO films) is used to form the inter-gate insulating film 14, and the silicon nitride film (SiN) is used to form the gate cap film 15.

The silicon substrate 10 right under the multi-layer gate forms a channel region in which a channel of each transistor is formed. Moreover, n-type impurity diffusion layers (second semiconductor regions) 16 of a conductive type opposite to that of the silicon substrate 10 is formed in the surface of the silicon substrate 10 positions on both sides of the channel region. The impurity diffusion layers 16 function as source, drain regions (S, D) of each transistor. Since the above-described multi-layer gate and impurity diffusion layers 16, 16 are disposed, each select transistor and memory cell transistor are formed.

The memory cell transistors MC1 to MCn are arranged so that the transistors disposed adjacent to each other share the impurity diffusion layer, and a memory cell unit is formed. The select transistors ST1, ST2 are disposed so that the select transistors and the memory cell transistors MC1, MCn on ends of the memory cell unit share one of the impurity diffusion layers. As described above, the NAND cell is formed including one memory cell unit and two select transistors ST1, ST2, and a memory cell array is formed including a plurality of NAND cells.

An insulating film 17 such as the silicon oxide film is formed on the multi-layer gate and impurity diffusion layer 16, and further a contact barrier film 18 such as the silicon nitride film is formed on the insulating film 17. An interlayer insulating film 19 such as a boron phosphorous silicate glass (BPSG) film is formed on the contact barrier film 18 so that the select transistors ST1, ST2 and n memory cell transistors MC1 to MCn are coated.

In the interlayer insulating film 19, contact holes C1, C2 are formed to reach the drain and source regions of the select transistors ST1, ST2 positioned in endmost portions of the transistors connected in series in the NAND cell. In the contact holes C1, C2, a bit line contact plug 20 and common source line contact plug 21 are formed. The bit line contact plug 20 and common source line contact plug 21 are formed of conductive films such as a low-resistance polycrystal silicon film and metal material.

Moreover, a metal wiring layer 22 is formed on the interlayer insulating film 19. A part of the metal wiring layer 22 is connected to the common source line contact plug 21, and functions as a common source line (SL). An interlayer insulating film 23 is formed further on the interlayer insulating film 19, and a metal wiring layer 24 is formed on the interlayer insulating film 23. The metal wiring layer 24 is connected to the bit line contact plug 20 via a contact plug 25, and functions as a bit line (BL).

The control gate 13 is connected in common between the NAND cells disposed adjacent to each other in a direction intersecting with the element isolating region ST1. In a region (not shown), the control gates 13 of the select transistors ST1, ST2 are connected to select gate lines SGS1, SGD1, and the control gates 13 of the memory cell transistors MC1 to MCn are connected to control gate lines CG1 to CGn. In a region (not shown), the charge accumulation layer 12 and control gate 13 of the select transistor are electrically connected to each other, and signals given to select gate lines SGS, SGD are directly applied to the charge accumulation layer 12. The common source line SL is connected in common between the NAND cells disposed adjacent to each other.

Moreover, the bit line BL is connected to a column selector (not shown), the select gate lines SGD, SGS and control gate lines CG1 to CGn are connected to a row decoder (not shown), and the common source line SL is connected to a deletion control circuit (not shown).

In the NAND cell, a part of the surface of the n-type impurity diffusion layer 16 between the multi-layer gates of the select transistors disposed adjacent to each other is removed, as shown in FIG. 2B. The impurity diffusion layer 16 has a recess, the bottom of which lies below the level of the surface of the silicon substrate 10 right under the gate insulating film. The recess caused the difference in level between a surface of the silicon substrate 10 right under the gate insulating film 11 and a surface of a part of the impurity diffusion layer 16 shall be referred to as "stepped portion", hereinafter. In particularly, the stepped portion in the memory cell array region is defined as "first stepped portion". In other words, an interface of the surface of the silicon substrate 10 in which a channel is formed and the gate insulating film 11 is positioned to be higher than the interface of the contact plug 20 and drain region 16 by a height of the first stepped portion, in the select transistor ST1. Additionally, in the select transistor ST1, the interface of the surface of the silicon substrate 10 in which the channel is formed and gate insulating film 11 exists in the same plane as that of the interface of the source region 16 and gate insulating film 11. In the select transistor ST2, the interface of the silicon substrate 10 surface in which the channel is formed and gate insulating film 11 is similarly positioned to be higher than the interface of the contact plug 21 and source region 16 by the height of the first stepped portion. Furthermore, even in the select transistor ST2, the interface of the surface of the silicon substrate 10 in which the channel is formed and gate insulating film 11 exists in the same plane as that of the interface of the drain region 16 and gate insulating film 11. As described above, the stepped portion is formed only in the select transistors ST1, ST2, and is not formed in the memory cell transistor.

Figures 3C, 3D:
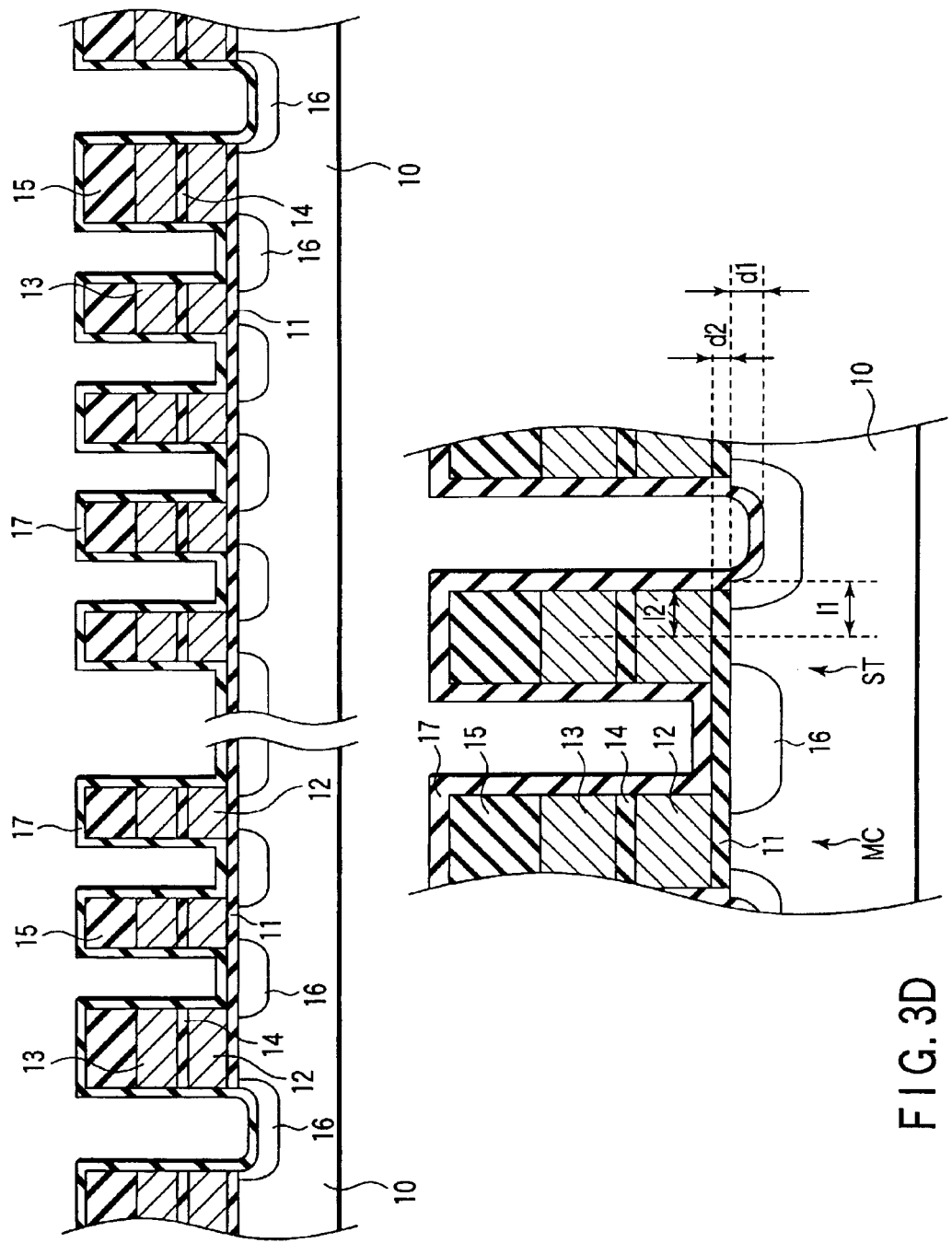

A manufacturing method of the NAND-type flash memory constituted as described above will next be described with reference to FIGS. 3A to 3F. FIGS. 3A to 3F excluding FIG. 3D are sectional views successively showing manufacturing steps of the flash memory according to the present embodiment, and FIG. 3D is an enlarged view of a partial region of FIG. 3C.

First, as shown in FIG. 3A, the element isolating region (not shown) is selectively formed in the p-type silicon substrate (or p-type well) 10. Thereafter, the gate insulating film 11 is formed on the surface of the channel region of the element region AA. Moreover, the charge accumulation layer 12, inter-gate insulating film 14, control gate 13, and gate cap film 15 are successively formed on the gate insulating film 11. Moreover, the charge accumulation layer 12, inter-gate insulating film 14, control gate 13, and gate cap film 15 are patterned in a self-aligning manner so that side wall portions are aligned, and the multi-layer gate is formed as shown in FIG. 3A.

Subsequently, as shown in FIG. 3B, the surface of the silicon substrate 10 is coated with a resist 40. Moreover, a photolithography technique is used to remove the resist 40 between the multi-layer gates of the select transistors disposed adjacent to (opposite to) each other. That is, the gate insulating film 11 is exposed on a region in which the drain region of the select transistor ST1 on a drain side, and the source region of the select transistor ST2 on a source side are to be formed. Subsequently, the gate insulating film 11 exposed between the multi-layer gates is etched, and the silicon substrate 10 between the multi-layer gates is further etched. As a result, a recess is formed in the surface of the silicon substrate 10 between the multi-layer gates of the select transistor. In this step, while an etching selection ratio is optimized, the etching of the gate insulating film 11 and silicon substrate 10 may continuously be etched in an etching treatment of a silicon oxide film base. Alternatively, after the gate insulating film 11 is etched by the etching treatment of the silicon oxide film base, the silicon substrate 10 may also be etched by a silicon-based etching treatment. In this case, the etching is sufficiently performed until a part of the gate insulating film 11 and silicon substrate 10 between the multi-layer gates of the select transistor is removed, so that a side surface of the multi-layer gate of the select transistor becomes vertical to the surface of the silicon substrate 10.

Subsequently, the resist 40 is removed by ashing. Thereafter, as shown in FIG. 3C, by a thermal oxidation method, the silicon oxide film 17 is formed on the upper surface and side wall of the multi-layer gate and on the silicon substrate 10 between the multi-layer gates. Furthermore, if necessary, the surface of the silicon substrate 10 is coated with the resist, and a resist opening portion is formed only in a memory cell array region by a photolithography process. Moreover, n-type impurities are injected in the silicon substrate 10 between the multi-layer gates to form the n-type impurity diffusion layer 16 which constitutes the source and drain regions. By the present step, the select transistors ST1, ST2 and n memory cell transistors MC1 to MCn are completed.

By the above-described steps, a structure is obtained in which a part of the interface of the n-type impurity diffusion layer 16 and insulating film 17 between the multi-layer gates of the select transistors disposed adjacent to each other is positioned to be lower than the interface of the p-type silicon substrate 10 and gate insulating film 11 of the channel portion by the height of the stepped portion.

An enlarged view of the partial region of FIG. 3C formed as described above is shown in FIG. 3D. As shown in the drawing, a height d1 of the stepped portion, namely a depth between the silicon substrate 10 surface contacting the gate insulating film 11 and the impurity diffusion layer 16 surface between the multi-layer gates, is larger than a film thickness d2 of the gate insulating film 11 (d1>d2). That is, the silicon substrate 10 is preferably etched so that the surface of at least a part of the impurity diffusion layer 16 between the multi-layer gates is deeper than the silicon substrate 10 surface contacting the gate insulating film 11 by d2 or more. This forms the side surface of the multi-layer gate of the select transistor to be vertical to the surface of the silicon substrate 10. Additionally, when the height of the stepped portion is excessively large, an adverse influence resulting from a short channel effect becomes tremendous. Therefore, the height needs to be set to such an extent that the adverse influence is not exerted. Moreover, when the stepped portion is formed right under the charge accumulation layer (a gate electrode of the select transistor) 12, that is, the edge of the stepped portion is positioned right under the charge accumulation layer 12, the film thickness of the gate insulating film 11 substantially increases, and characteristics of the select transistor are deteriorated. Therefore, the stepped portion is preferably disposed outside the edge of the gate electrode 12. That is, a distance 11 to a stepped portion from the center of the gate electrode 12 is preferably larger than a distance 12 to the edge from the center of the gate electrode 12.

Figure 3E:
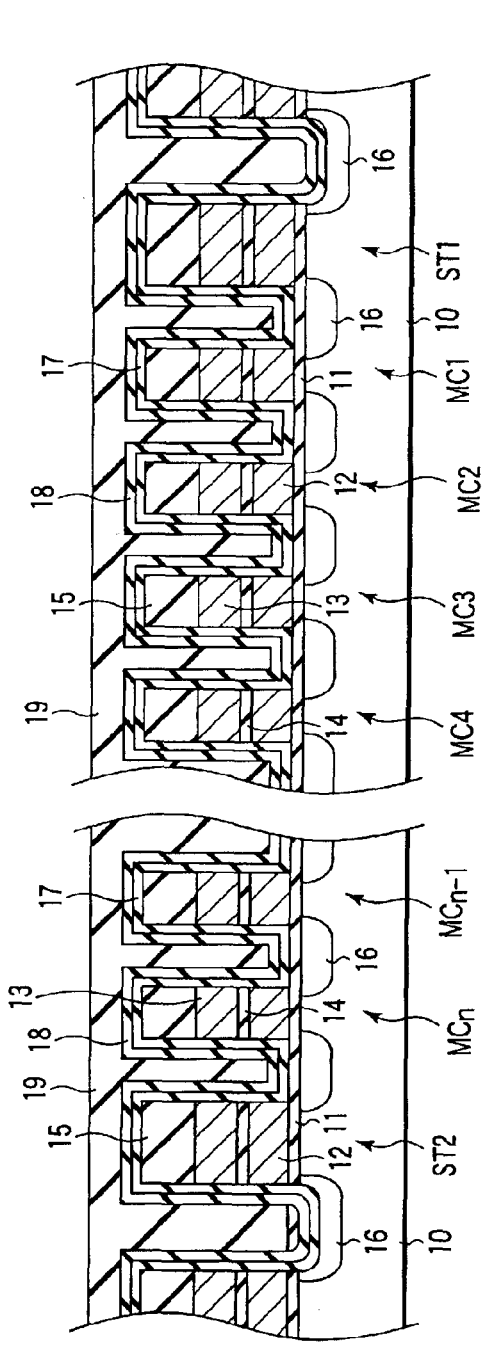
FIGS. 3E to 3F are sectional views successively showing the manufacturing steps of the semiconductor memory device according to the first embodiment of the present invention.

Next as shown in FIG. 3E, the contact barrier film 18 is formed of the silicon nitride film on the silicon oxide film 17 and subsequently the interlayer insulating film 19 is formed of the BPSG film on the contact barrier film 18 to coat the multi-layer gate.

Figure 3F:
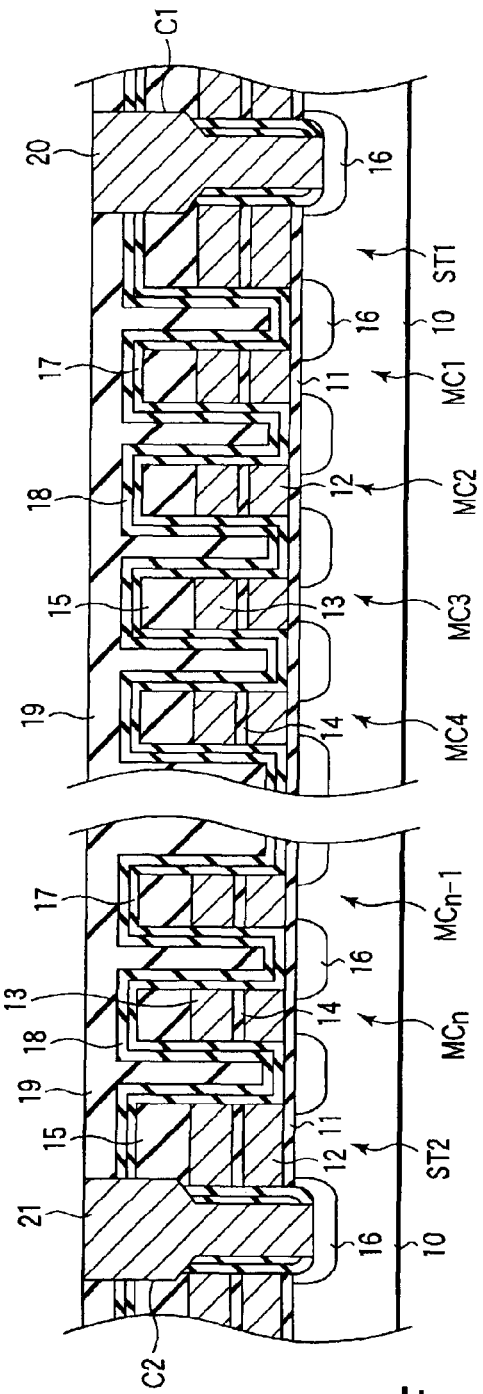

Subsequently, as shown in FIG. 3F, the photolithography technique and etching are used to form the contact hole C1 which reaches the drain region of the select transistor ST1 and the contact hole C2 which reaches the source region of the select transistor ST2. Moreover, in the respective contact holes C1, C2, the low-resistance polycrystal silicon film, or a contact material such as a metal film of tungsten is buried, and flatted so that the bit line contact plug 20 and source line contact plug 21 are formed.

Thereafter, the metal wiring layer 22 is formed on the interlayer insulating film 19. A part of the metal wiring layer 22 forms the common source line SL. Furthermore, the interlayer insulating film 23 is formed on the interlayer insulating film 19, and the contact plug 25 electrically connected to the bit line contact plug 20 is formed in the interlayer insulating film 23. Moreover, the metal wiring layer 24 is formed on the interlayer insulating film 23 to constitute the bit line BL so that the memory cell array region of the NAND-type flash memory shown in FIGS. 2A and 2B is completed.

With the NAND-type flash memory according to the present embodiment, a part (middle portion) of the surface of the n-type impurity diffusion layers (drain and source regions) 16, 16 in contact with the bit line contact plug 20 and source line contact plug 21 is removed, in the select transistors ST1, ST2. Consequently, the recess, namely the first stepped portion, is formed in the impurity diffusion layer 16. Therefore, a part of the interface of the bit line contact plug 20 and impurity diffusion layer 16 or the interface of the source line contact plug 21 and impurity diffusion layer 16 is positioned to be lower than the interface of the channel region and gate insulating film 11 of the select transistor by the height of the first stepped portion.

Subsequently, to obtain the constitution, the etching is performed so that a part of the gate insulating film 11 and silicon substrate 10 between the select transistors disposed adjacent to each other is etched. As a result, the side surface of the multi-layer gate of the select transistor becomes substantially vertical to the silicon substrate 10 surface.

Therefore, it is possible to form the insulating film 17 and contact barrier film 18 even in the etched portion of the silicon substrate 10. That is, when the contact plugs 20, 21 are formed, the insulating film 17 and contact barrier film 18 are left (formed) between the multi-layer gates of the select transistors ST1, ST2 and the contact plugs 20, 21. As a result, the multi-layer gates of the select transistors ST1, ST2 and the contact plugs 20, 21 can be inhibited from electrically short-circuiting. Therefore, reliability of the select transistor is enhanced, and this can additionally contribute to enhancement of the reliability and manufacturing yield of the NAND-type flash memory.

Moreover, according to the constitution of the first embodiment, the stepped portion is formed only in the impurity diffusion layers 16, 16 connected to the contact plugs 20, 21 in the select transistors ST1, ST2. That is, no stepped portion is formed in the impurity diffusion layer 16 connected to the memory cell unit in the select transistors ST1, ST2. Therefore, the deterioration of characteristics of the select transistor, which is caused by the short channel effect by the surface of the n-type impurity diffusion layer 16 being deeper than the channel region surface, can be minimized. Furthermore, no stepped portion is formed in the n-type impurity diffusion layers 16 of the memory cell transistor MC. Therefore, with respect to the memory cell transistor MC, the characteristics can be prevented from being deteriorated by the above-described cause. Moreover, the adverse influence by the short channel effect can be suppressed. As a result, further miniaturization of the select transistor and memory cell transistor is possible.

Furthermore, for the above-described reason, the height of the stepped portion is larger than the thickness of the gate insulating film 11, and the stepped portion is preferably disposed outside the edge of the multi-layer gate. Moreover, the gate insulating film 11 of the memory cell transistor and the gate insulating film 11 of the select transistor are substantially the same insulating film formed at the same time. Therefore, the same forming steps are used for these insulating films so that manufacturing cost can be reduced.

As described above, in the constitution of the present embodiment, at least one of the bit line contact plug and common source line contact plug is formed in the multi-layer gate of the select transistor in the self-aligning manner. As a result, the multi-layer gate of the select transistor and the contact plug can be prevented from short-circuiting. Moreover, since the short channel effect of the select transistor and memory cell transistor is not deteriorated, each transistor can further be miniaturized.

<Second Embodiment>

Figure 4A:
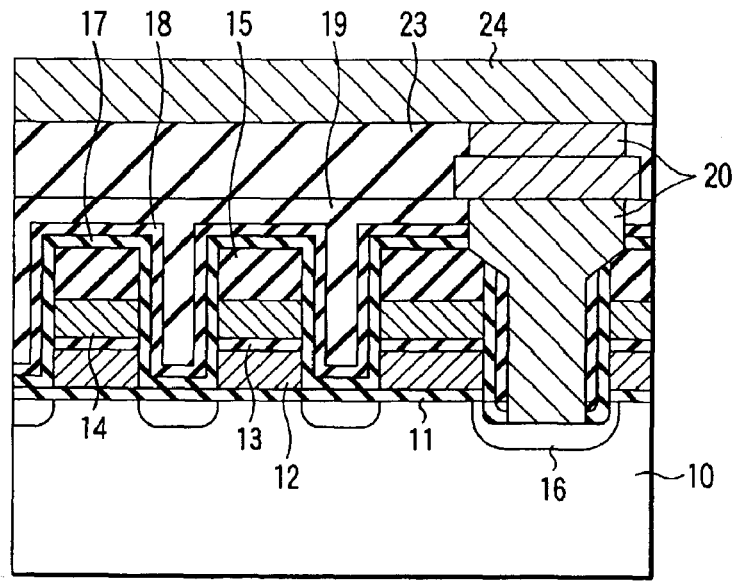
FIGS. 4A and 4B are sectional views of the semiconductor memory device according to a second embodiment of the present invention.
Figure 4B:
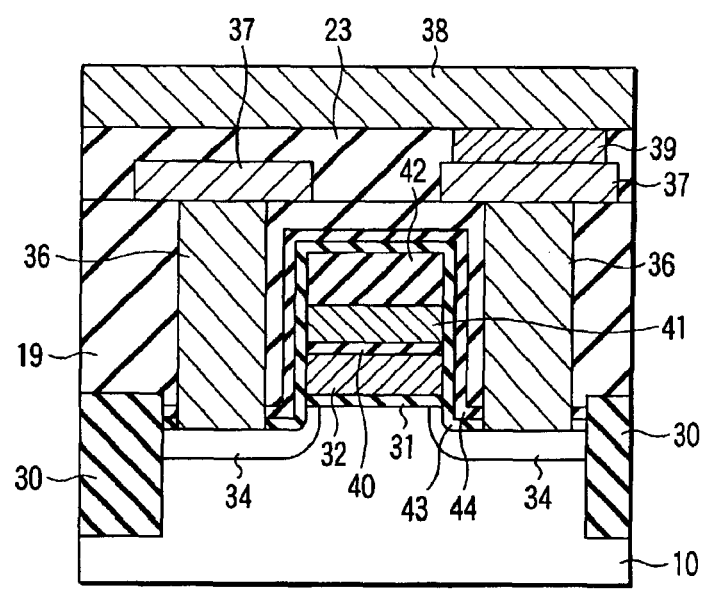

The semiconductor memory device according to a second embodiment of the present invention will next be described with reference to FIGS. 4A and 4B. FIG. 4A is a sectional view of the NAND-type flash memory according to the present embodiment along a bit line direction. Moreover, FIG. 4B is a sectional view of a peripheral circuit region. The peripheral circuit region is a region in which circuits other than the memory cell, such as the column selector and decoder circuit, are formed, or a region in which an MOS transistor as a high withstand voltage system with a write voltage applied thereto is formed. Moreover, in the second embodiment, the structure described in the first embodiment is applied to the MOS transistor in the peripheral circuit region. Additionally, since the structure of the memory cell array region is similar to the structure described with reference to FIGS. 2A and 2B of the first embodiment, the description thereof is omitted.

The peripheral circuit region is electrically separated from the memory cell array region by a element isolating region 30 disposed in the silicon substrate 10. Moreover, the MOS transistor is formed on the silicon substrate. The MOS transistor includes a gate electrode formed on the silicon substrate 10 with a gate insulating film 31 interposed therebetween, and an impurity diffusion layer 34 formed in the silicon substrate 10. The gate electrode has a multi-layer gate structure including a semiconductor layer 32 formed on the gate insulating film 31, a inter-gate insulating film 40 formed on the semiconductor layer 32, and a semiconductor layer 41 formed on the inter-gate insulating film 40. Moreover, the gate cap film 15 is formed on the semiconductor layer 41. Additionally, in a region (not shown), the semiconductor layers 32, 41 are electrically connected, and operate as a usual MOS transistor. That is, the gate electrode of the MOS transistor constituting the peripheral circuit has a structure similar to that of the select transistor in the memory cell array region.

The impurity diffusion layer 34 has a recess, the bottom of which lies below the level of the surface of the silicon substrate 10. That is, at least a part of the impurity diffusion layer 34 surface of the MOS transistor in the peripheral circuit is etched from the silicon substrate 10 surface by the etching. The recess caused the reference in level between a surface of the silicon substrate 10 right under the gate insulating film 31 and a surface of a part of the impurity diffusion layer 34 shall be referred to as "stepped portion", hereinafter. In particularly, the stepped portion in the peripheral circuit is defined as "second stepped portion". The height of the second stepped portion, namely depth between the silicon substrate 10 surface contacting the gate insulating film 11 and the impurity diffusion layer 34 surface between the multi-layer gates, is the same as that of the first stepped portion.

Moreover, insulating films 43, 44 are formed on the impurity diffusion layer 34 and multi-layer gate, and the interlayer insulating films 19, 23 formed on the insulating film 44. Furthermore, contact plugs 36, 39 which reach the source/drain region 34 of the MOS transistor, and metal wiring layers 37, 38 electrically connected to the plugs are disposed to form the peripheral circuit region.

According to the semiconductor memory device of the second embodiment, the stepped portion is formed not only in the select transistor in the memory cell array region but also in the MOS transistor in the peripheral circuit region. That is, in the MOS transistor in the peripheral circuit region, interfaces of the contact plugs 36, 36 and impurity diffusion layers 34, 34 are formed to be lower than the interface of the channel region surface and gate insulating film 31 by a height of the second stepped portion. Moreover, the second stepped portion is set to be of the same degree as that of the first stepped portion.

The above-described structure can be formed simultaneously with formation of the memory cell array region by the steps described in the first embodiment. That is, an RIE process described with reference to FIG. 3B is simultaneously performed not only in the memory cell array region but also in the peripheral circuit region, so that the stepped portion in the memory cell and select transistor can simultaneously be formed. Moreover, the contact plug formation step described with reference to FIG. 3F is simultaneously performed in not only the memory cell array region but also the peripheral circuit region, so that the contact plugs 20, 21, 36, 36 can simultaneously be formed.

That is, the MOS transistor of the peripheral circuit region is formed in the same step as that of the transistor in the memory cell array region. Therefore, the second stepped portion of the same degree as that of the first stepped portion is formed in not only the memory cell array region but also the peripheral circuit region. Thereby, without performing an extra step of forming a mask in the peripheral circuit region, the structure described in the first embodiment can be realized in the steps similar to the conventional steps.

Furthermore, even with the forming of the contact plugs 36 for example, by low-resistance polysilicon similarly as the contact plugs 20, 21 of the select transistor, No special trouble is caused, when the MOS transistor in the peripheral circuit region is, for example, a high withstand voltage system transistor with the write voltage applied thereto. This is because it is sufficient for the contact plug 36 to mainly fulfill a role of transmitting the voltage.

That is, according to the manufacturing method of the NAND-type flash memory described above, the formation step of the contact hole opening and contact plug on the drain and source regions of the peripheral transistor can be performed simultaneously with the formation step of the contact hole opening and contact plug of the select transistor. Therefore, the manufacturing cost of the NAND-type flash memory can be reduced.

<Third Embodiment>

Figure 5:
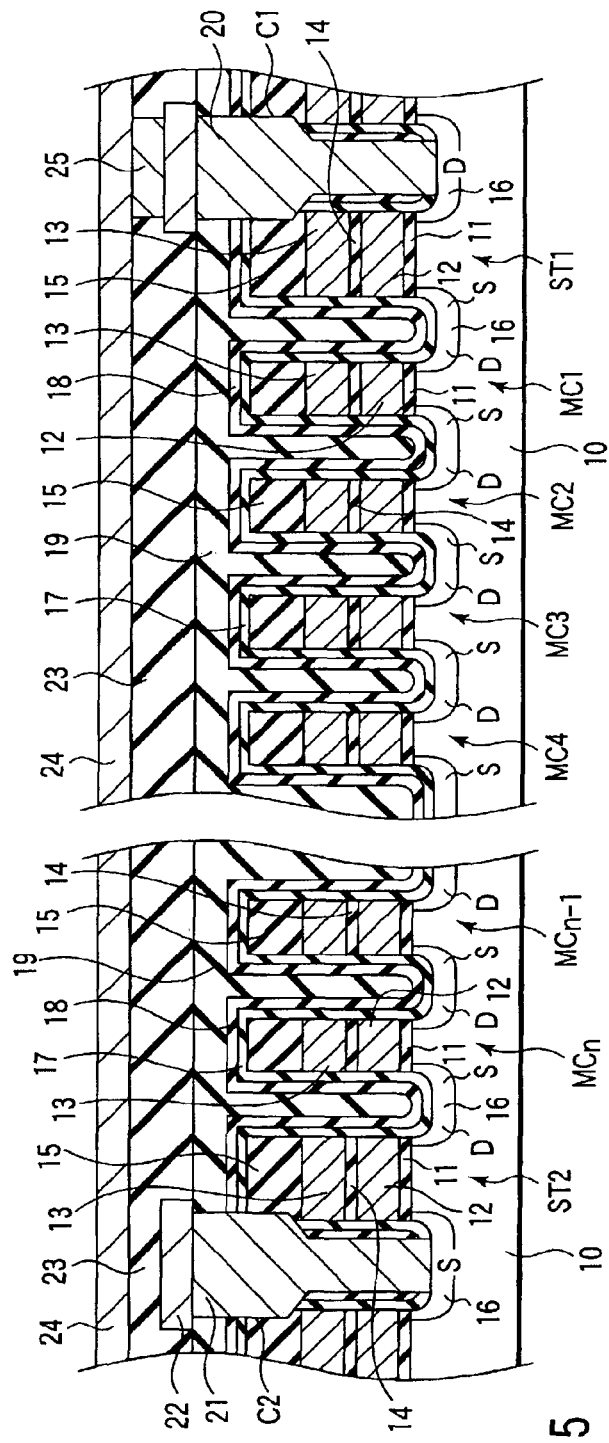
FIG. 5 is a sectional view of the semiconductor memory device according to a third embodiment of the present invention.

The semiconductor memory device according to a third embodiment of the present invention will next be described with reference to FIG. 5. FIG. 5 is a sectional view of the NAND-type flash memory according to the third embodiment, and corresponds to a sectional view taken along the direction of the line 2B—2B in FIG. 2A.

As shown in the drawing, for the constitution according to the third embodiment, the impurity diffusion layer 16 of the memory cell transistors MC1 to MCn has the recess, namely the first stepped portion, the bottom of which lies below the level of the surface of the silicon, in the structure described in the first embodiment. That is, at least a part of the interface of the source/drain region 16 and insulating film 17 of each of the memory cell transistors MC1 to MCn is formed to be lower than the interface of the channel region (silicon substrate 10 right under the charge accumulation layer 12) surface and gate insulating film 11 by the height of the first stepped portion.

A manufacturing method of the NAND-type flash memory constituted as described above will next be described with reference to FIGS. 6A to 6E. FIGS. 6A to 6E excluding FIG. 6C are sectional views successively showing the manufacturing steps of the flash memory according to the third embodiment, and FIG. 6C is an enlarged view of the partial region of FIG. 6B.

First, the structure shown in FIG. 3A is obtained by the steps described in the first embodiment.

Figure 6A:
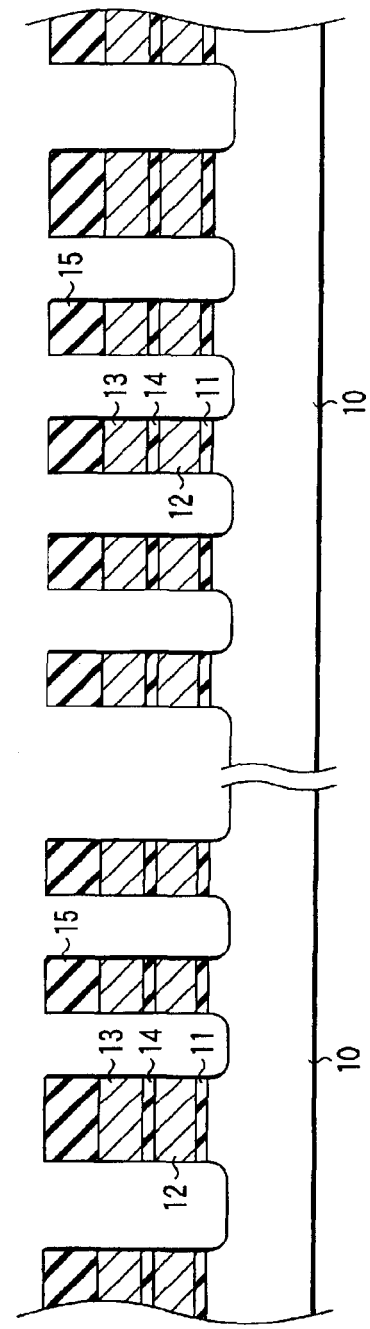
FIGS. 6A and 6B are sectional views successively showing the manufacturing steps of the semiconductor memory device according to the third embodiment of the present invention.

Subsequently, as shown in FIG. 6A, the gate insulating film 11 positioned between the multi-layer gates is etched, the silicon substrate 10 between the multi-layer gates is further etched, and the recess (first stepped portion) is formed in the silicon substrate 10. These steps are different from the steps of FIG. 3B of the first embodiment in that the recess is formed not only between the multi-layer gates of the adjacent select transistors but also between the multi-layer gates of the adjacent memory cell transistors and between the multi-layer gates of the select transistor and memory cell transistor disposed adjacent to each other. By the present steps, a part of the silicon substrate 10 between the multi-layer gates of the select transistor and memory cell transistor is removed, and the side walls of the multi-layer gates of the select transistor and memory cell transistor become substantially vertical to the silicon substrate 10 surface.

Figure 6B:
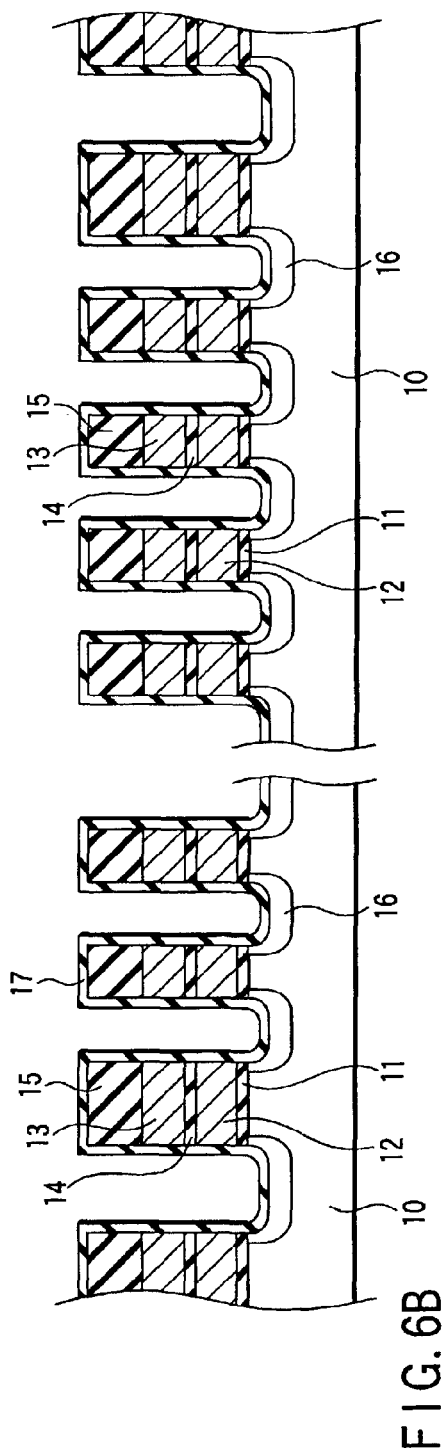
Figure 6C:
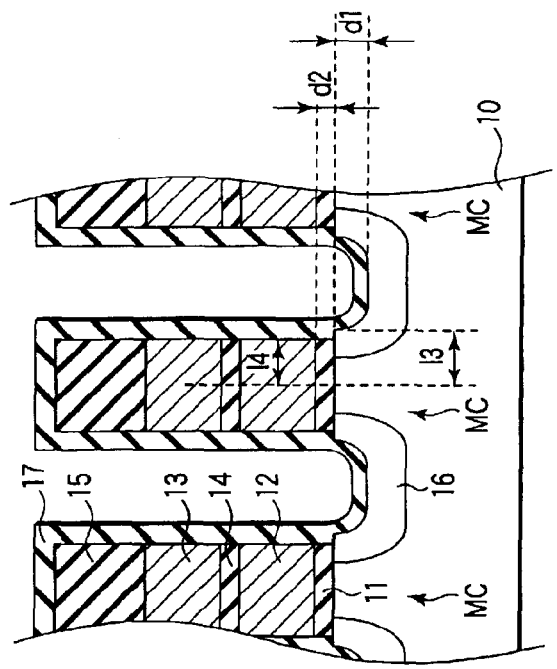
FIG. 6C is an enlarged view of the partial region of FIG. 6B.

Subsequently, as shown in FIG. 6B, the insulating film 17 is formed on the upper surface and side wall of the multi-layer gate and on the silicon substrate 10 between the multi-layer gates by the thermal oxidation method. Furthermore, n-type impurities are injected into the silicon substrate 10 between the multi-layer gates, so that the n-type impurity diffusion layer 16 constituting the source/drain region is formed. By the present steps, the select transistors ST1, ST2 and n memory cell transistors MC1 to MCn are completed.

The enlarged view of the partial region of FIG. 6B formed as described above is shown in FIG. 6C. FIG. 6C shows the memory cell transistor. The constitution of the select transistor is similar to that of FIG. 3D described in the first embodiment.

As shown, the height d1 of the stepped portion, namely depth between the silicon substrate 10 surface contacting the gate insulating film 11 and the impurity diffusion layer 16 surface between the multi-layer gates, is preferably larger than the film thickness d2 of the gate insulating film 11 (d1>d2). That is, the silicon substrate 10 is preferably etched so that at least a part of the surface of the impurity diffusion layer 16 between the multi-layer gates is deeper than the silicon substrate 10 surface contacting the gate insulating film 11 by d2 or more. Moreover, when the stepped portion is formed right under the charge accumulation layer 12, the film thickness of the gate insulating film 11 increases, and the characteristics of the memory cell are deteriorated. Therefore, the stepped portion is preferably disposed outside the charge accumulation layer 12 (13>14). That is, also with the memory cell transistor, conditions similar to those of the select transistor described in the first embodiment are preferably satisfied.

Subsequently, as described in the first embodiment with reference to FIG. 3E, the contact barrier film 18 and inter-layer insulating film 19 are formed to obtain the structure shown in FIG. 6D.

Subsequently, as described in the first embodiment with reference to FIG. 3D, the bit line contact plug 20 and source line contact plug 21 are formed to obtain the structure shown in FIG. 6E.

Thereafter, as described in the first embodiment, the common source line SL and bit line BL are formed, so that the memory cell array region of the NAND-type flash memory shown in FIG. 5 is completed.

According to the NAND-type flash memory of the third embodiment, the side surface of the multi-layer gate of the select transistor becomes substantially vertical to the silicon substrate 10 surface. Therefore, similarly as the first embodiment, the multi-layer gates of the select transistors ST1, ST2 and the contact plugs 20, 21 can be inhibited from electrically short-circuiting. Therefore, the reliability of the select transistor is enhanced, and additionally the reliability and manufacturing yield of the NAND-type flash memory can be enhanced.

Figure 7A:
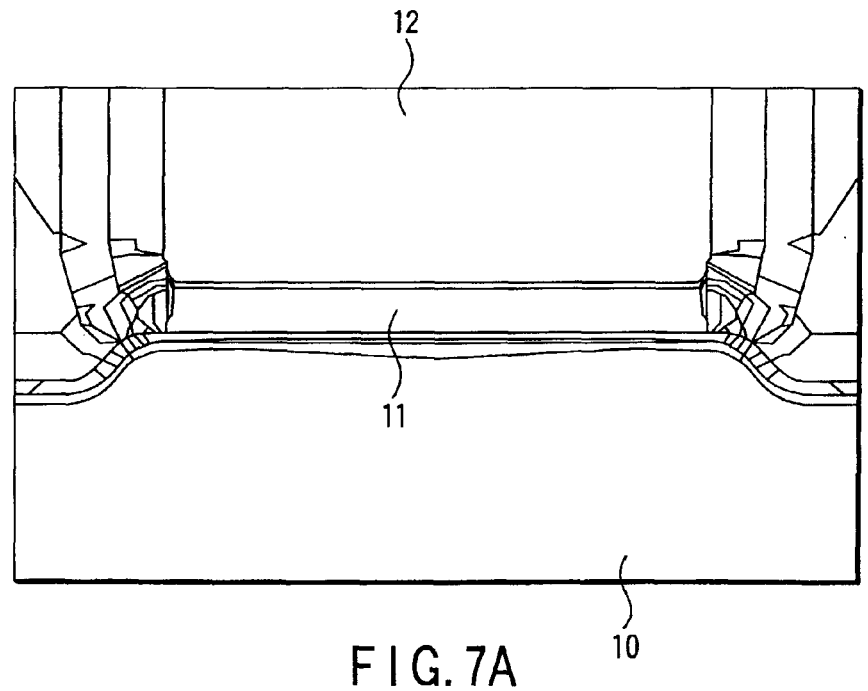
FIG. 7A is a sectional view of a memory cell included in the semiconductor memory device according to the third embodiment of the present invention, and a diagram showing an electric field distribution in the vicinity of a gate insulating film.
Figure 7B:
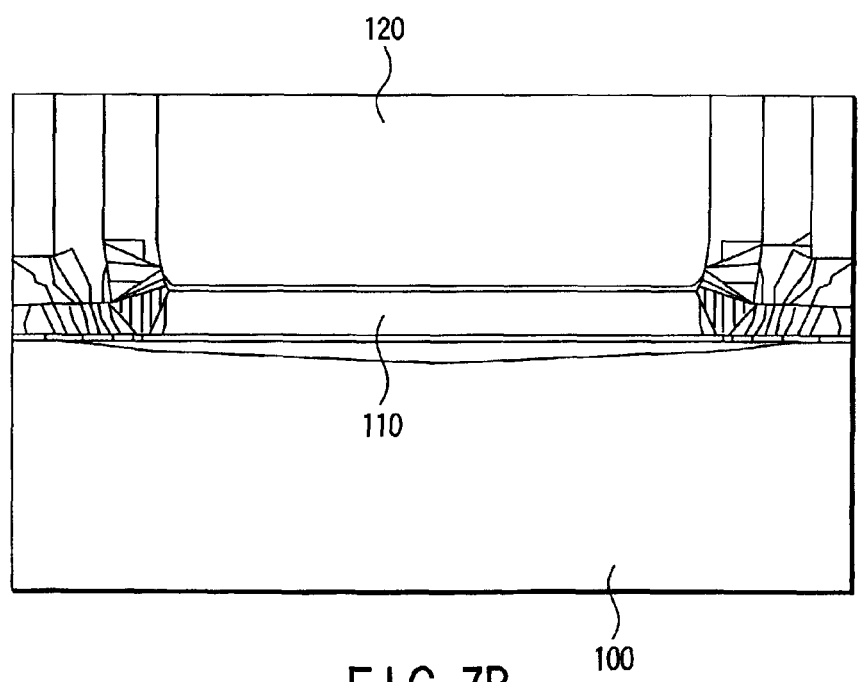
FIG. 7B is a sectional view of the memory cell included in the conventional semiconductor memory device, and a diagram showing the electric field distribution in the vicinity of the gate insulating film.

Furthermore, according to the structure of the third embodiment, an electric field concentration in a charge accumulation layer 12 edge is suppressed, and the reliability of the memory cell transistor can be enhanced. This respect will be described with reference to FIGS. 7A and 7B. Both FIGS. 7A and 7B show an electric field distribution in the vicinity of the gate insulating film 11 in the silicon substrate 10 positively biased with respect to the charge accumulation layer 12. FIG. 7A is a sectional view of a memory cell transistor having the structure of the third embodiment, and FIG. 7B is a sectional view of the memory cell transistor having the conventional structure. Moreover, a plurality of lines generated from the charge accumulation layer edge in the drawing are contours indicating electric field intensities, and the electric field weakens toward the outside.

As shown in FIG. 7A, according to the structure of the third embodiment, since the silicon substrate 10 (impurity diffusion layer 16) between the multi-layer gates is deep, the electric field does not easily expand to the outside of the multi-layer gate. In the conventional structure shown in FIG. 7B, the electric field expands broadly to the outside of the multi-layer gate, as compared with the structure of the third embodiment. The broad expansion of the electric field to the outside of the multi-layer gate means that the electric field concentrates particularly on the charge accumulation layer edge portion in the channel length direction of the charge accumulation layer. However, in the structure of the third embodiment, the expansion of the electric field is inhibited. In other words, in the channel length direction of the charge accumulation layer, an electric field distribution is brought close to uniformity. Therefore, the electric field concentration in the charge accumulation layer edge is prevented. As a result, electrons can be prevented from being trapped into the gate insulating film 11 by the tunnel current, and the reliability of the memory cell can be enhanced.

Moreover, the stepped portion is disposed outside the charge accumulation layer 12. Therefore, the film thickness of the gate insulating film 11 of the transistor is uniform along a channel direction. Therefore, the above-described effect is obtained without deteriorating the characteristics of the memory cell. This can easily be realized, when the insulating film 17 is formed on the multi-layer gate side walls and on the impurity diffusion layer 16 between the multi-layer gates by thermal oxidation. This is because the oxidation quickly advances in the side wall portion of the multi-layer gate rather than on the impurity diffusion layer 16. This respect is similar to the first embodiment.

Furthermore, in the first embodiment, not to form the stepped portion in the memory cell transistor, the resist needs to be formed on the memory cell transistor in the step of FIG. 3B. However, according to the third embodiment, since the stepped portion is also formed in the memory cell transistor, the resist is unnecessary. That is, one photolithography process is unnecessary as compared with the manufacturing method of the first embodiment, and the manufacturing steps can be simplified.

Figure 8A:
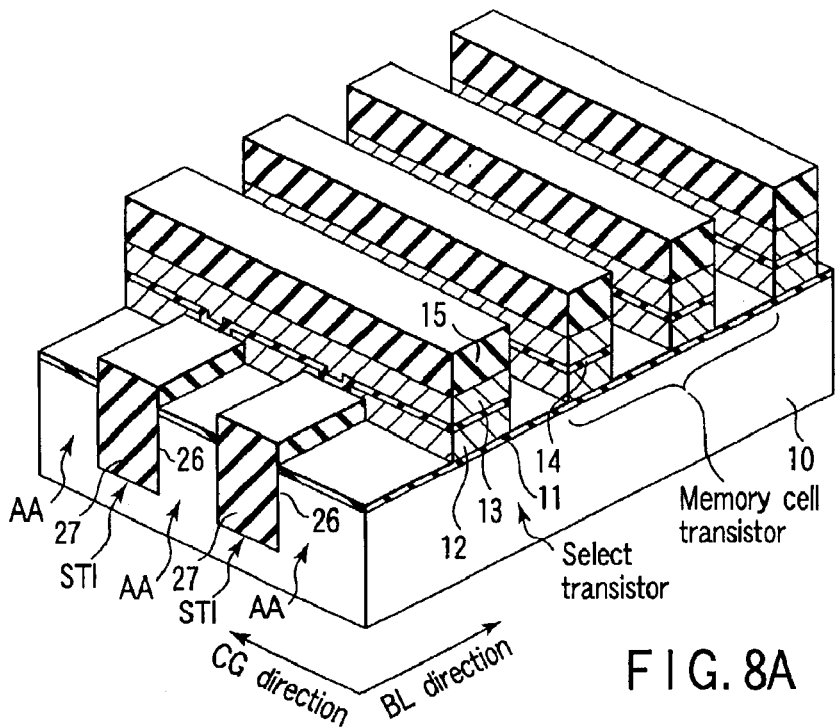
FIGS. 8A to 8C are sectional views successively showing the manufacturing steps of the semiconductor memory device according to a modification example of the third embodiment of the present invention.
Figure 8B:
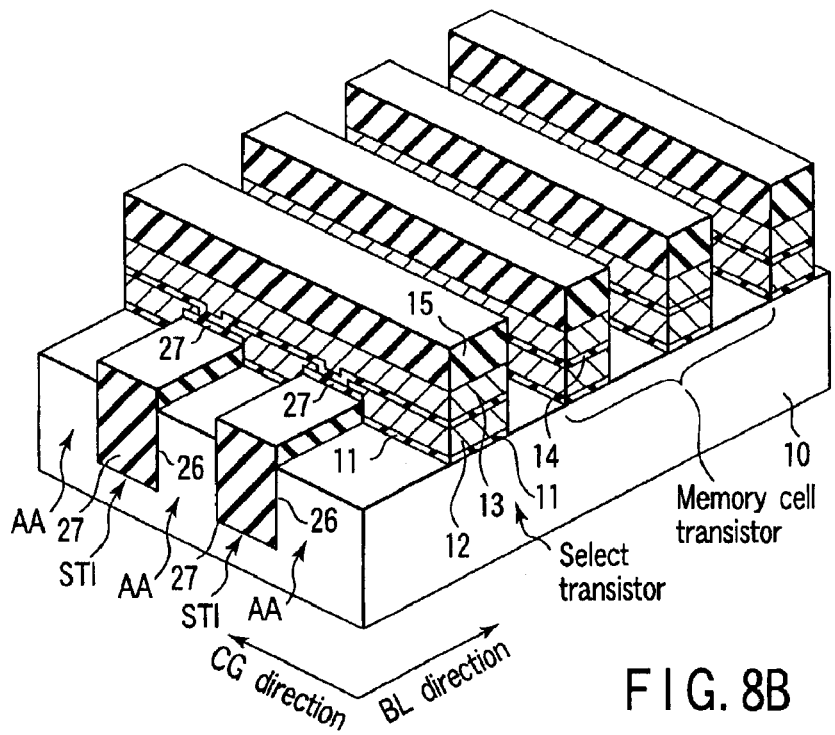
Figure 8C:
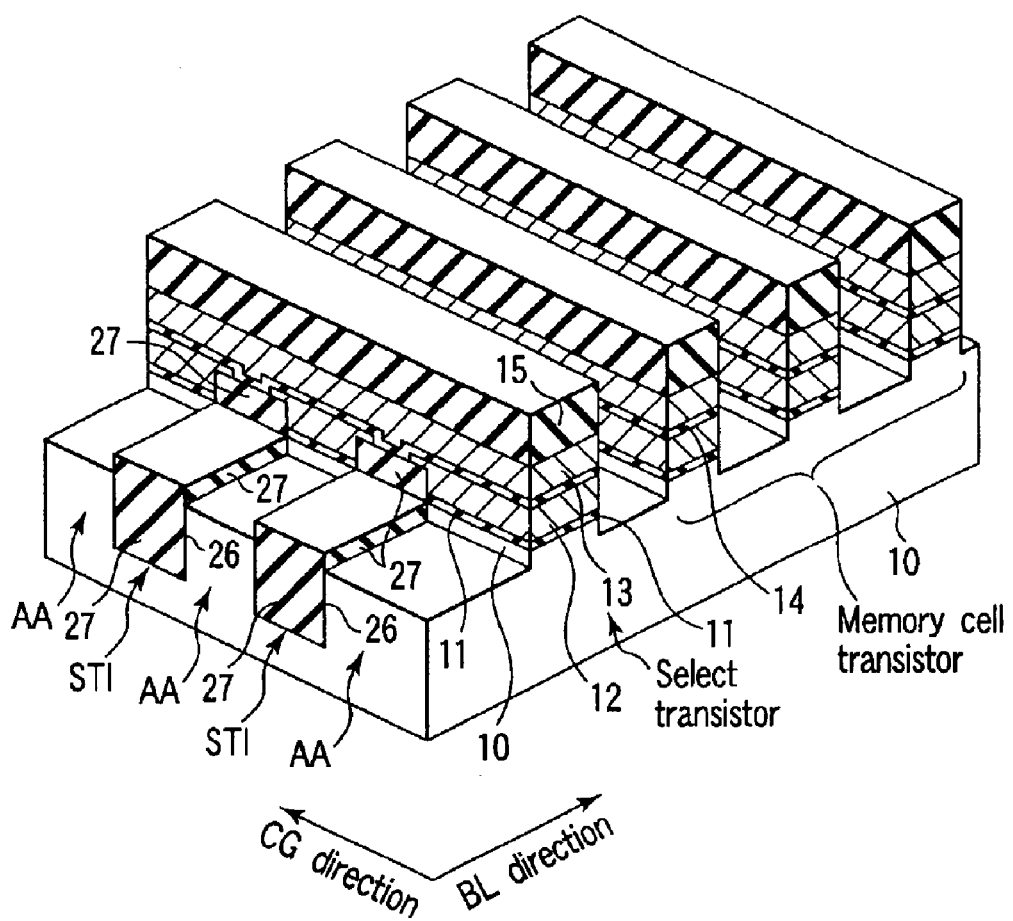

FIGS. 8A to 8C are sectional perspective views successively showing some steps of the manufacturing method of the flash memory according to a modification example of the third embodiment. Particularly, the etching step of the silicon substrate between the multi-layer gates described with reference to FIG. 6A is shown. In this step, a manufacturing method of a self-aligning contact structure proposed in Jpn. Pat. Appln. KOKAI Publication No. 2002-057230 (U.S. patent application Ser. No. 09/925,418), the entire contents (all pages) of these references being incorporated herein by reference, is applied to the etching step of the silicon substrate.

First, FIG. 8A is a sectional perspective view corresponding to FIG. 3A. As shown, each element isolating region ST1 includes a trench 27 formed in the silicon substrate 10, and an insulating film 26 such as a silicon oxide film with which the trench 27 is filled. Additionally, the upper surface of the element isolating region ST1 is usually higher than that of the silicon substrate 10. Therefore, when the bit line contact and common source line contact are to be formed with the self-aligning contact, the contact barrier film 18 remains on a element isolating region ST1 side surface. To solve the problem, in the above-described patent applications, a technique of etching the insulating film 26 in the state shown in FIG. 8A and lowering the upper surface of the element isolating region ST1 is disclosed.

As shown in FIG. 8B, this technique is used to first etch the upper surface of the insulating film 26 constituting the element isolating region ST1 by the etching of the silicon oxide film base, and to etch and remove the gate insulating film 11 between the multi-layer gates.

Here, even after the gate insulating film 11 is etched, the etching is further continued. Thereby, not only the insulating film 26 but also the silicon substrate 10 between the multi-layer gates can be etched. As a result, as shown in FIG. 8C, the silicon substrate surface between the multi-layer gates can be set to be lower than the silicon substrate surface right under the multi-layer gate. Additionally, the upper surface of the insulating film 26 between the multi-layer gates can be set to be lower than that of the insulating film 26 right under the multi-layer gate. Of course, since the insulating film 26 under the multi-layer gate is not etched, the charge accumulation layers 12 disposed adjacent to each other in a direction of control gate line CG are electrically separated.

With use of the above-described manufacturing method, since the multi-layer gate functions as the mask, for example, the photolithography step, and a new step for etching the silicon substrate 10 are not required. When only an etching time of the insulating film 26 is simply lengthened, the silicon substrate 10 can be etched. Therefore, the flash memory according to the third embodiment can be manufactured without complicating or elaborating the manufacturing steps. Moreover, in addition to the effect of the third embodiment, the effect described in the above-described patent application can be obtained.

The steps describes with reference to FIGS. 8A to 8C can be performed in the method according to the first embodiment, too. First, the structure of FIG. 8A is made. Then a resist of the same type as the resist 40 shown in FIG. 3B is applied to the memory cells. Etching is performed by a silicon oxide-based etching treatment. Those parts of the silicon substrate 10 and the upper surface region of the insulating film 27 which lie between the gate electrodes of the select transistors are therefore removed. As a result, a structure according to the first embodiment is provided. This structure has not only the advantages specified in the description of the first embodiment, but also the advantages disclosed in the patent application identified above.

<Fourth Embodiment>

Figure 9:
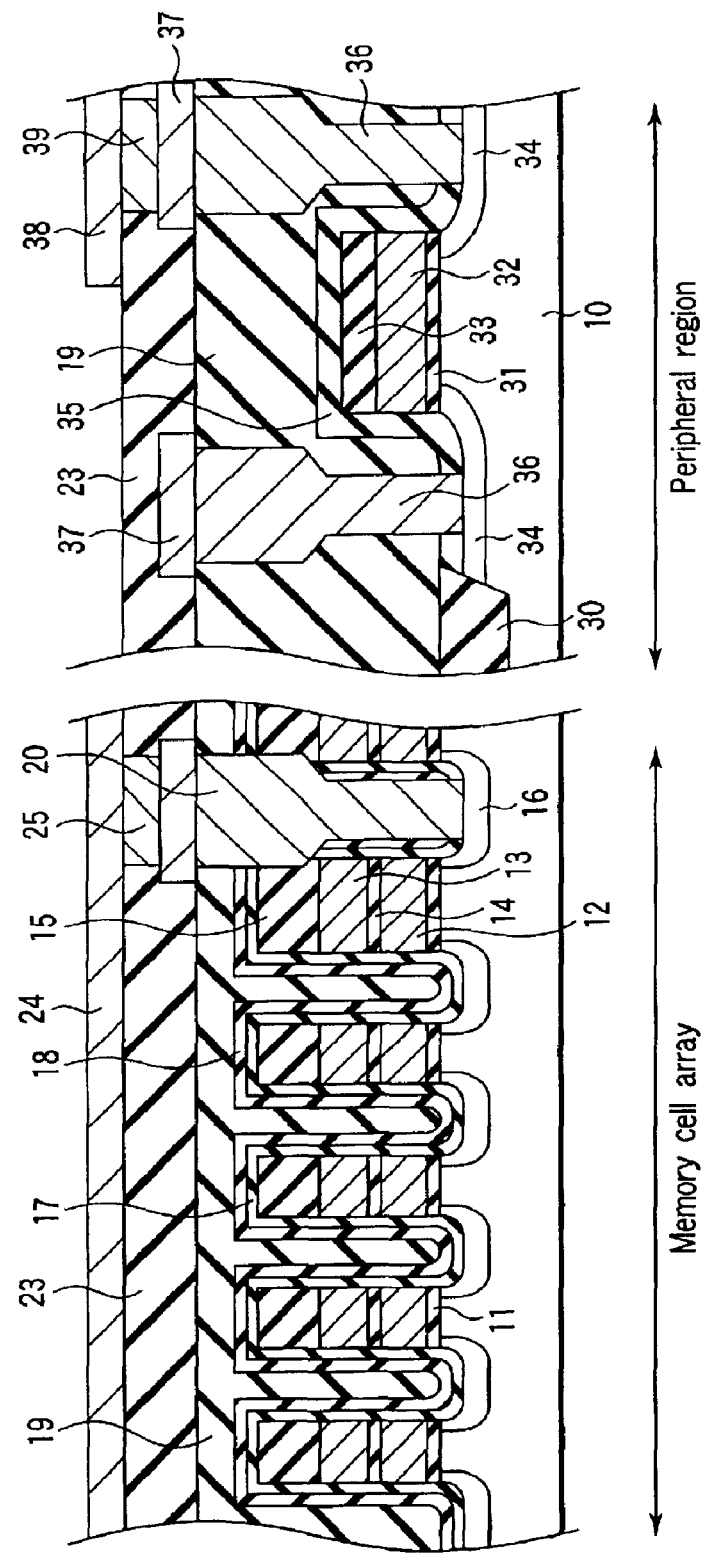
FIG. 9 is a sectional view of the semiconductor memory device according to a fourth embodiment of the present invention.

The semiconductor memory device according to a fourth embodiment of the present invention will next be described with reference to FIG. 9. FIG. 9 is a sectional view of the NAND-type flash memory along the bit line direction, and shows a sectional structure of the memory cell array region and peripheral circuit region. The fourth embodiment corresponds to a combination of the second and third embodiments, and the structure described above in the third embodiment is applied to the MOS transistor in the peripheral circuit region. Additionally, since the structure of the memory cell array region is similar to that of FIG. 5 described above in the third embodiment, the description is omitted. Moreover, the structure of the peripheral circuit region is substantially the same as that of the second embodiment, and will briefly be described hereinafter.

As shown, in the peripheral circuit region, the MOS transistor is formed which includes the gate electrode 32 formed on the silicon substrate 10 with the gate insulating film 31 interposed therebetween, an insulating film 33, and the impurity diffusion layer 34 formed in silicon substrate 10.

Similarly as the second embodiment, the impurity diffusion layer 34 of the MOS transistor has the recess, namely second stepped portion, the bottom of which lies below the level of the surface of the silicon substrate 10. The second stepped portion has the same height as that of the stepped portion.

According to the flash memory of the fourth embodiment, the transistor in the memory cell array region described above in the third embodiment, and the MOS transistor in the peripheral circuit can be formed by the same steps. That is, the structure described in the third embodiment can be realized in the steps similar to the conventional steps.

<Fifth Embodiment>

Figure 10A:
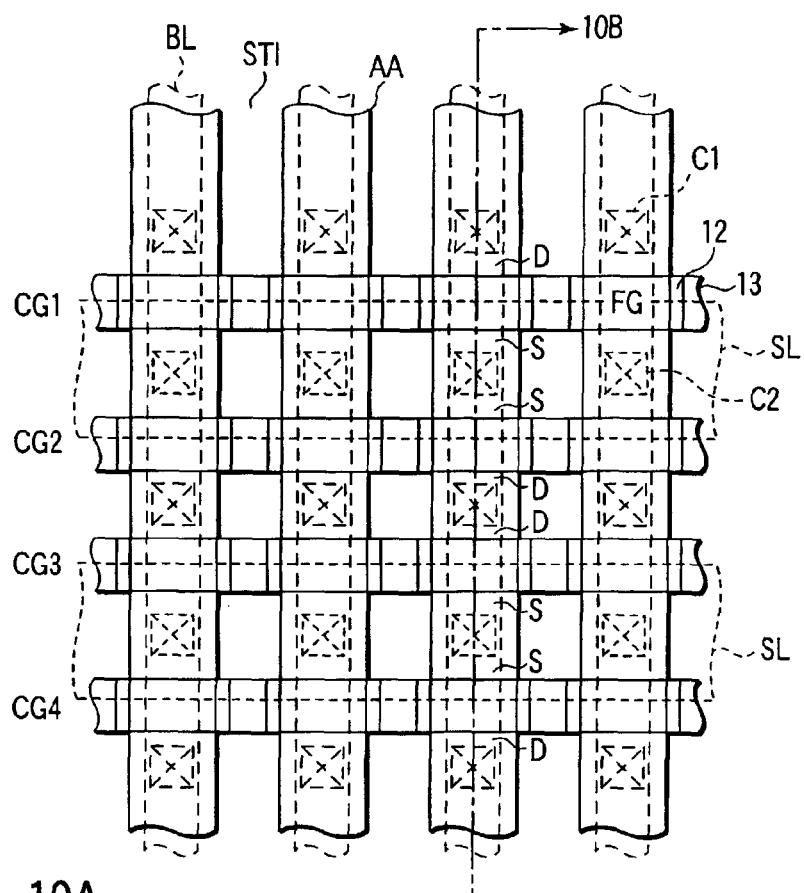
FIG. 10A is a plan view of the semiconductor memory device according to a fifth embodiment of the present invention.
Figure 10B:
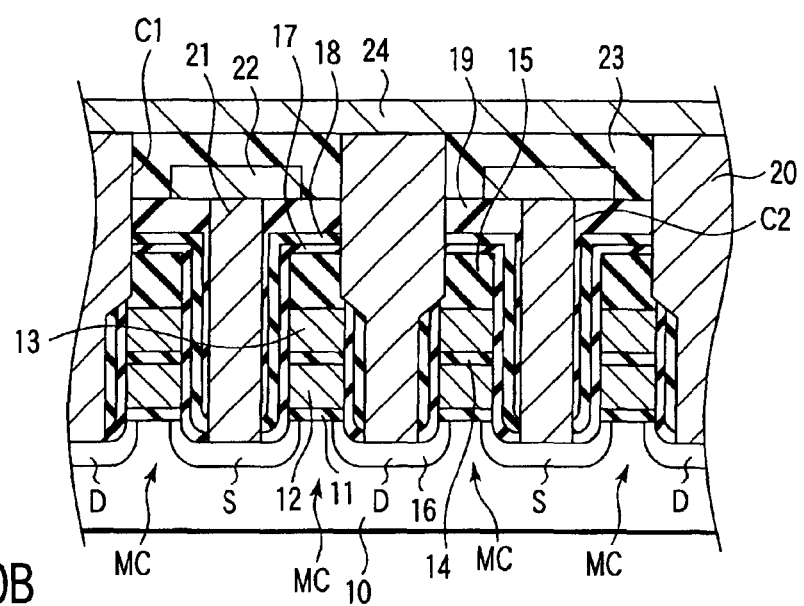
FIG. 10B is a sectional view along a line 10B—10B in FIG. 10A.

The semiconductor memory device according to a fifth embodiment of the present invention will next be described with reference to FIGS. 10A and 10B. In the fifth embodiment, the first or third embodiment is applied to a NOR-type flash memory. FIG. 10A is a plan view of the NOR-type flash memory according to the fifth embodiment, and FIG. 10B is a sectional view taken along a line 10B—10B.

As shown, similarly as the first and third embodiments, a plurality of element isolating regions ST1 are formed in strip forms in the p-type silicon substrate (or a p-type well region) 10. Moreover, a region between the adjacent element isolating regions ST1 constitutes the element region AA.

In the element region AA, a plurality of memory cell transistors MC is formed. Each memory cell transistor MC includes the multi-layer gate formed on the silicon substrate with the gate insulating film (tunnel insulating film) 11 interposed therebetween. The multi-layer gate includes: the charge accumulation layer (FG) 12 formed on the gate insulating film 11 and electrically separated for each memory cell; the control gate 13 formed on the charge accumulation layer 12; the inter-gate insulating film 14 formed between the charge accumulation layer 12 and control gate 13; and the gate cap film 15 formed on the control gate 13. The impurity diffusion layers 16 of the n-type opposite to the conductive type of the silicon substrate 10 in which the channel is formed are formed on the both sides of the multi-layer gate in the silicon substrate 10. The impurity diffusion layers 16 function as the source and drain regions (S, D). Each memory cell transistor and memory cell transistor are formed including the multi-layer gate and impurity diffusion layer 16.

The memory cell transistors MC disposed adjacent to each other are arranged so as to share the source or drain region 16. The insulating film 17 is formed on the multi-layer gate and impurity diffusion layer 16, and the contact barrier film 18 is further formed on the insulating film 17. Additionally, the impurity diffusion layer 16 between the adjacent multi-layer gates has recess, namely first stepped portion, the bottom of which lies below the level of the surface of the channel region. That is, the interface of the silicon substrate 10 in which the channel is formed and gate insulating film 11 is positioned higher than the interface of a part of the impurity diffusion layer 16 and the insulating film 17.

Moreover, the interlayer insulating film 19 is formed on the contact barrier film 18. Furthermore, in the interlayer insulating film 19, the contact holes C1, C2 are formed which reach the drain region 16, source region 16 of the memory cell transistor MC, and the bit line contact plug 20 and common source line contact plug 21 are formed in the contact holes C1, C2.

Furthermore, the metal wiring layer 22 is formed on the interlayer insulating film 19. A part of the metal wiring layer 22 is connected to the common source line contact plug 21, and functions as the common source line (SL). The interlayer insulating film 23 is further formed on the interlayer insulating film 19, and the metal wiring layer 24 is formed on the interlayer insulating film 23. The metal wiring layer 24 is connected to the bit line contact plug 20 via the contact plug 25, and functions as the bit line (BL).

Furthermore, the control gate 13 is connected in common in the device regions AA disposed adjacent to each other in a direction intersecting with the element isolating region ST1, and connected to the control gate lines CG1 to CGn in a region (not shown).

Moreover, the bit line BL is connected to the column selector (not shown), the control gate lines CG1 to CGn are connected to the row decoder (not shown), and the common source line SL is connected to the erase control circuit (not shown).

A manufacturing method of the NOR-type flash memory constituted as described above is similar to that of the first or third embodiment, and the description thereof is therefore omitted. It is of course possible to use the method described in the modification example of the third embodiment.

As described above, according to the NOR-type flash memory of the fifth embodiment, as described in the first embodiment, the occurrence of short circuit between the charge accumulation layer 12 and bit line contact plug 20 can be inhibited.

Moreover, the interface between the silicon substrate 10 and gate insulating film 11 is higher than the interface between the plug 21 and source region 16 and the between the plug 20 and drain region 16. Consequently, the electric field concentration in the charge accumulation layer 12 edge is prevented, and the reliability of the memory cell can be enhanced. In the NOR-type flash memory, electrons are discharged to the source region 16 or silicon substrate 10 from the charge accumulation layer 12 so as to rewrite data. That is, a bias which is positive with respect to the charge accumulation layer 12 is applied to the silicon substrate 10, and the electrons are discharged into the silicon substrate 10. In this case, the electric field distribution in the vicinity of the gate insulating film 11 according to the fifth embodiment is obtained as shown in FIG. 7A described above in the third embodiment. That is, since the silicon substrate 10 (impurity diffusion layer 16) between the multi-layer gates is deep, the electric field does not easily expand to the outside of the multi-layer gate. Therefore, the electric field concentration in the charge accumulation layer edge is prevented, and the electrons can be prevented from being trapped into the gate insulating film 11 by the tunnel current. Moreover, the bias positive with respect to the charge accumulation layer 12 is applied to the source region 16, and thereby the electric field distribution in the vicinity of the gate insulating film 11 in discharging the electrons to the source region 16 is a distribution in which only one edge of the charge accumulation layer 12 is noted in FIG. 7A. Similarly in the conventional structure, only one edge of the charge accumulation layer of FIG. 7B may be noted. Even in this case, the region in which the electric field is intense can be prevented from expanding to the outside of the multi-layer gate, and the electrons can be prevented from being trapped into the gate insulating film 11 by the tunnel current.

As described above, even with the NOR-type flash memory, the effect similar to that of the third embodiment can be obtained.

<Sixth Embodiment>

Figure 11:
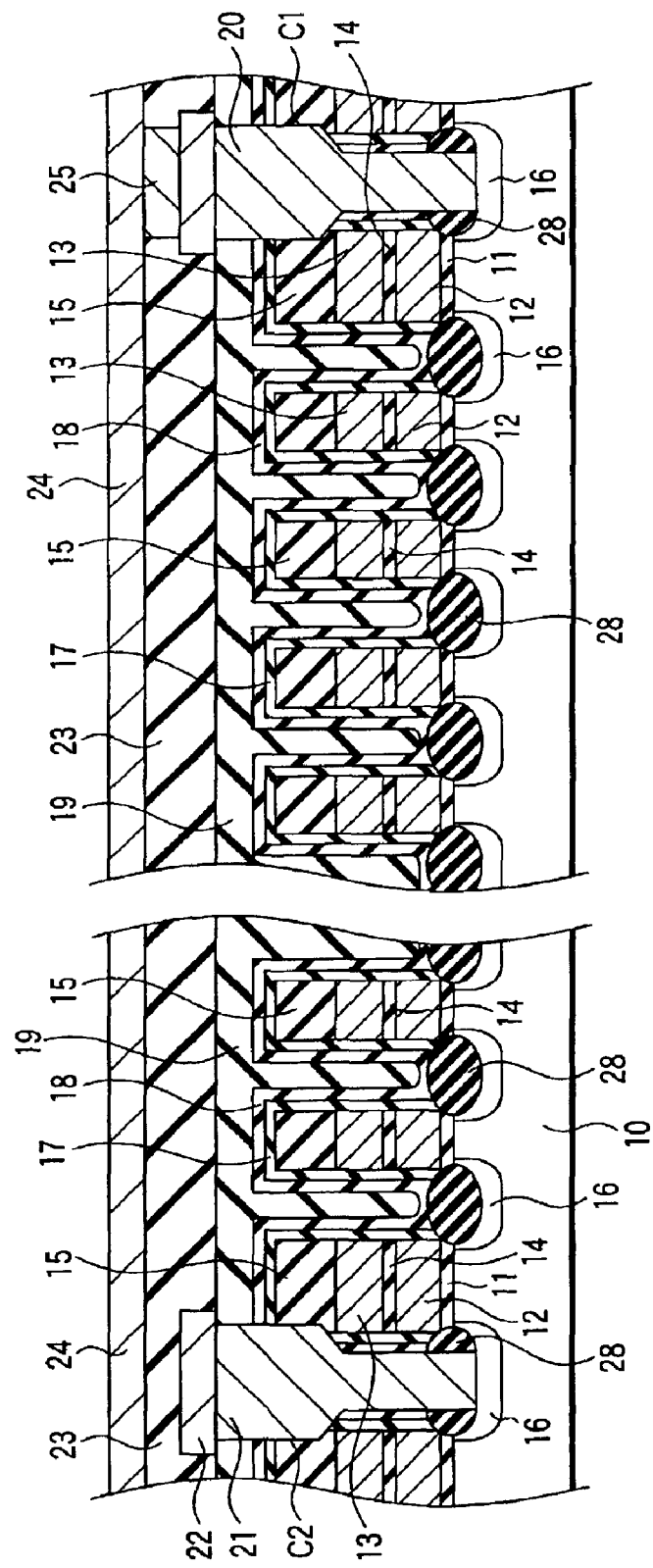
FIG. 11 is a sectional view of the semiconductor memory device according to a sixth embodiment of the present invention.

The semiconductor memory device according to a sixth embodiment of the present invention will next be described with reference to FIG. 11. FIG. 11 is a sectional view of the NAND-type flash memory along the bit line direction.

For the NAND-type flash memory according to the sixth embodiment, in the structure of FIG. 5 described above in the third embodiment, instead of forming the stepped portion, an insulating film 28 having a film thickness larger than that of the insulating film 17 is formed on the n-type impurity diffusion layer 16 between the multi-layer gates. Since the insulating film 28 is formed in and under the impurity diffusion layer 16, the interface of the silicon substrate 10 and gate insulating film 11 is positioned higher than the interface of a part of the impurity diffusion layer 16 and insulating film 28.

A manufacturing method of the flash memory constituted as described above will next be described.

First the structure of FIG. 3A described in the first embodiment is formed. Subsequently, instead of etching the silicon substrate 10, the thermal oxidation is performed to form the insulating film (silicon oxide film) 17. In this case, the film thickness of the insulating film 17 is controlled to be larger on the silicon substrate 10 than on the top and side surfaces of the multi-layer gate. This can be realized, when impurities for increasing an oxidation rate, such as fluorine, are injected into silicon substrate 10 between the multi-layer gates in the structure of FIG. 3A. Then, the oxidation rapidly advances in the region between the multi-layer gates as compared with the other regions. Therefore, the insulating film 17 in this region has a large film thickness, and the insulating film 17 is formed in a deep portion of the silicon substrate 10 (referred to as the insulating film 28).

Thereafter, the n-type impurities are injected into the silicon substrate 10 between the multi-layer gates, the n-type impurity diffusion layer 16 forming the source, drain region is thereby formed, and the structure of FIG. 11 is obtained by the steps similar to those of the third embodiment.

Even in the structure according to the sixth embodiment, the stepped portion is formed so that the surface of the impurity diffusion layer 16 between the multi-layer gates becomes lower than the silicon substrate 10 right under the multi-layer gate, and therefore the effects similar to those of the third embodiment are obtained.

Of course, the insulating film 28 is preferably formed so that the thickness thereof in the impurity diffusion layer 16 is larger than the film thickness of the gate insulating film 11. Moreover, the end of the insulating film 28 is preferably disposed outside the charge accumulation layer 12.

<Seventh Embodiment>

The semiconductor memory device according to a seventh embodiment of the present invention will next be described with reference to FIG. 12. FIG. 12 is a sectional view of the NAND-type flash memory along the bit line direction. The seventh embodiment is a combination of the first and sixth embodiments.

As shown, in the constitution of FIG. 11 described above in the seventh embodiment, the insulating film 28 is formed only on the n-type impurity diffusion layer 16 between the adjacent select transistors.

Even with the present constitution, the effect similar to that of the first embodiment can be obtained.

<Eighth Embodiment>

The semiconductor memory device according to an eighth embodiment of the present invention will next be described with reference to FIG. 13. FIG. 13 is a sectional view of the NOR-type flash memory along the bit line direction. The eighth embodiment is a combination of the fifth and sixth embodiments.

In the constitution of FIG. 10B, instead of forming the stepped portion in the impurity diffusion layer 16, the insulating film 28 is formed.

Even with the present constitution, the effect similar to that of the fifth embodiment can be obtained. As described above, according to the semiconductor memory device according to the first to fifth embodiments of the present invention, in the MOS transistor in which at least one of the source and drain regions is connected to the contact plug, the stepped portion is formed in the impurity diffusion layer. The stepped portion causes the difference in level between the surface of the impurity diffusion layer and the surface of the silicon substrate in which the channel is formed. Consequently, the part of the surface of the impurity diffusion layer is positioned lower than the channel region surface. Moreover, the contact plug is formed on the impurity diffusion layer positioned lower than the channel region surface. Then, when a part of the impurity region surface is removed, the gate electrode side surface becomes substantially vertical to the semiconductor substrate surface. As a result, the contact plug can be prevented from short-circuiting with the gate electrode, and the reliability of the semiconductor memory device can be enhanced.

Furthermore, according to the semiconductor memory device of the first and second embodiments, in the NAND-type flash memory, the stepped portion is formed only on the select transistor, and is not formed in the memory cell transistor. As a result, the characteristic deterioration caused by the short channel effect in the memory cell transistor can be prevented.

Furthermore, according to the semiconductor memory device of the third and fourth embodiments, even in the MOS transistor in which both the source and drain regions are not connected to the contact plug, such as the memory cell transistor of a NAND-type memory, the stepped portion is formed. As a result, the electric field distribution in the channel length direction of the charge accumulation layer in the memory cell transistor nearly becomes uniform, and the electric field concentration in the charge accumulation layer edge is prevented. Therefore, the electrons can be prevented from being trapped into the gate insulating film by the tunnel current, and the reliability of the memory cell transistor can be enhanced. Of course, as described in the first and second embodiments, the stepped portion formed in the memory cell transistor needs to be formed to such an extent that the adverse influence caused by the short channel effect is not exerted.

Furthermore, according to the semiconductor memory device of the second and fourth embodiments, the stepped portion is formed not only in the memory cell array region but also in the MOS transistor in the peripheral circuit region. Therefore, the memory cell array region and the MOS transistor of the peripheral circuit region can simultaneously be formed in the same steps. Therefore, the manufacturing steps can be simplified, and manufacturing cost can be reduced.

Furthermore, according to the semiconductor memory device of the sixth to eighth embodiments, instead of forming the stepped portion in the first to fifth embodiments, the insulating film is formed so as to sink in the impurity diffusion layer. Even with these embodiments, the effects similar to those of the first to fifth embodiments are obtained. Additionally, the constitution in which the insulating film 28 is formed as described in the sixth to eighth embodiments may be applied not only to the memory cell array region but also to the peripheral circuit region described in the second and fourth embodiments.

In addition, the embodiments have been described above in which the height of the stepped portion is not less than that of the gate insulating film. However, even when the height is smaller than that of the gate insulating film, the similar effects are of course obtained. In a viewpoint of the prevention of the electric field concentration, the height of the stepped portion is preferably large. However, when the stepped portion is excessively large, the short channel effect is supposed to remarkably appear. Therefore, it is necessary to set the depth to such an extent that such adverse influence is not generated. Additionally, the embodiments of the present invention are not limited to the NAND-type and NOR-type flash memories described above in the embodiments, and can also be applied to an AND-type flash memory and general EEPROM. Furthermore, the embodiment of the present invention can be applied to general semiconductor memory devices in which the electrons are transmitted/received via the insulating film by an applied high voltage in order to rewrite the data, further to general semiconductor memories including nonvolatile memory cell transistors and select transistors, and to memory embedded devices.

The embodiments of the present invention as shown in FIGS. 2A–13 have many different implementations. A few of these implementations are shown in FIGS. 14–20.

Figure 14:
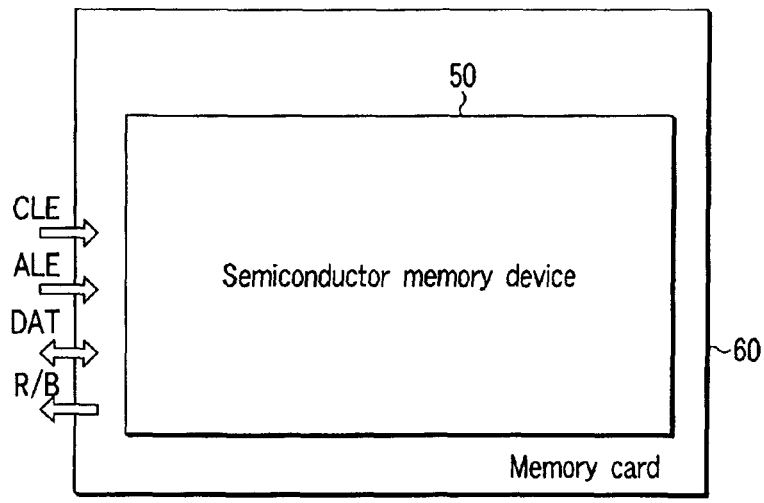
FIG. 14 is a block diagram showing an illustrative internal structure of a memory card in accordance with an embodiment of the present invention.

In one example, shown in FIG. 14, a memory card 60 includes the semiconductor memory device 50 as disclosed in one of the FIGS. 2A–13. As shown in FIG. 14, the memory card 60 is operable to receive/output predetermined signals and data from/to an external device (not shown).

A signal line (DAT), a command line enable signal line (CLE), an address line enable signal line (ALE) and a ready/busy signal line (R/B) are connected to the memory card 60 having the semiconductor memory device 50. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device 50 is ready, or not.

Figure 15:
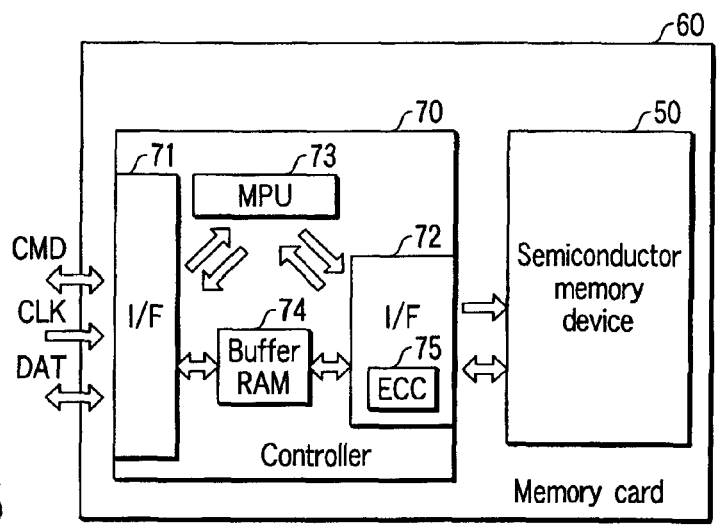
FIG. 15 is a block diagram showing an illustrative internal structure of a memory card in accordance with an embodiment of the present invention.

Another exemplary implementation is shown in FIG. 15. The memory card shown in FIG. 15 differs from the memory card presented in FIG. 14 in that the memory card 60 of FIG. 15 includes, in addition to the memory device 50, a controller 70 which controls the semiconductor memory device 50 and receives/transfers predetermined signals from/to an external device (not shown).

The controller 70 includes an interface unit (I/F) 71, 72, a microprocessor unit (MPU) 73, a buffer RAM 74 and an error correction code unit (ECC) 75. The interface unit (I/F) 71, 72 receives/outputs predetermined signals from/to an external device (not shown) and the semiconductor memory device 50, respectively. The microprocessor unit 73 converts a logical address into a physical address. The buffer RAM 74 stores data temporarily. The error correction code unit 75 generates an error correction code. A command signal line (CMD), a clock signal line (CLK) and a signal line (DAT) are connected to the memory card 60. It should be noted that the number of the control signal lines, bit width of the signal line (DAT) and a circuit construction of the controller 70 could be modified suitably.

Figure 16:
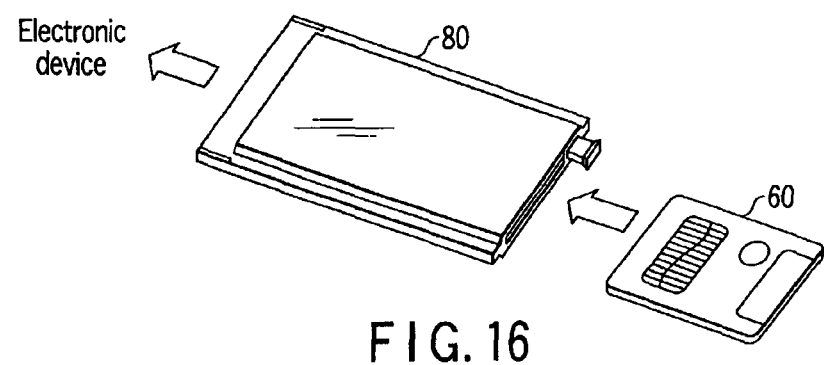
FIG. 16 is an illustrative example of cardholder and a memory card in accordance with an embodiment of the present invention.

Another exemplary implementation is shown in FIG. 16. As can be seen from FIG. 16, a memory cardholder 80 is provided for receiving a memory card 60 having a memory device 50 as discussed in connection with FIGS. 2A–13. The cardholder 80 is connected to an electronic device (not shown) and is operable as an interface between the card 60 and the electronic device. The cardholder 80 may perform one or more of the functions of the controller 70 described in connection with FIG. 15.

Figure 17:
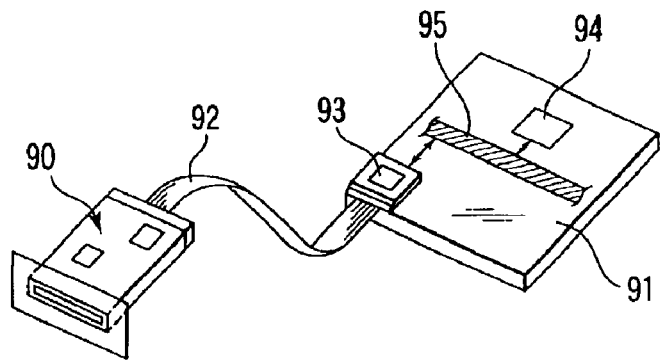
FIG. 17 shows a connecting apparatus operable to receive a memory card or cardholder.

Another exemplary implementation will be explained with reference to FIG. 17. FIG. 17 shows a connecting apparatus operable to receive a memory card or a cardholder, either of which includes the memory device. The memory card or cardholder is insertable in the connecting apparatus 90 and is electrically connectable to the apparatus. The connecting apparatus 90 is connected to a board 91 via a connecting wire 92 and an interface circuit 93. The board 91 contains a CPU (Central Processing Unit) 94 and a bus 95.

Figure 18:
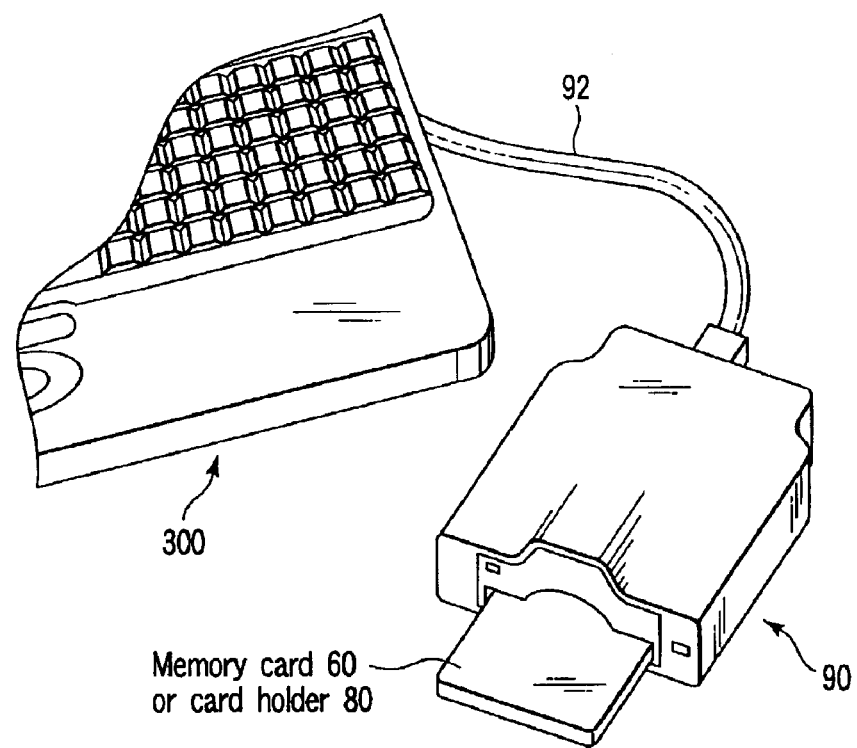
FIG. 18 is an illustrative example of a connecting apparatus connected to a personal computer via a connecting wire and having a memory card inserted therein.

Another exemplary implementation is shown in FIG. 18. As shown in FIG. 18, a memory card 60 or a cardholder 80, either of which includes the memory device, is inserted and electrically connectable to a connecting apparatus 90. The connecting apparatus 90 is connected to a PC (Personal Computer) 300 via connecting wire 92.

Figure 19:
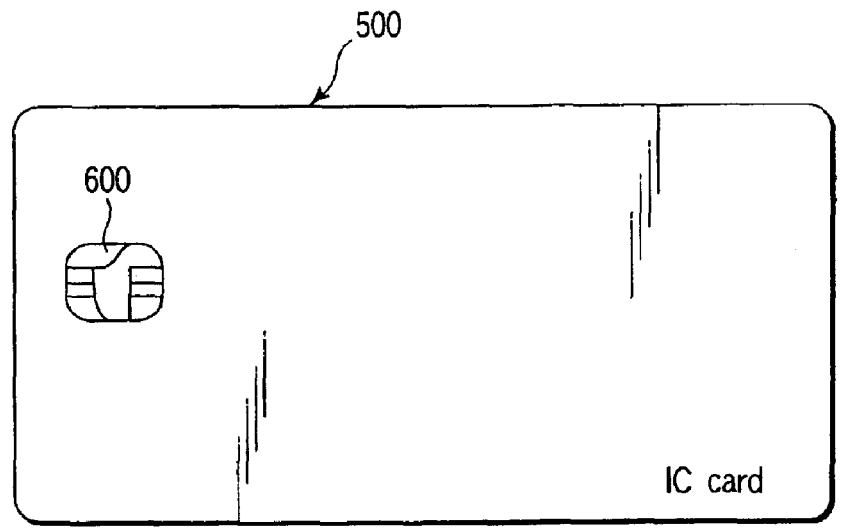
FIG. 19 shows an IC card in accordance with an embodiment of the present invention.
Figure 20:
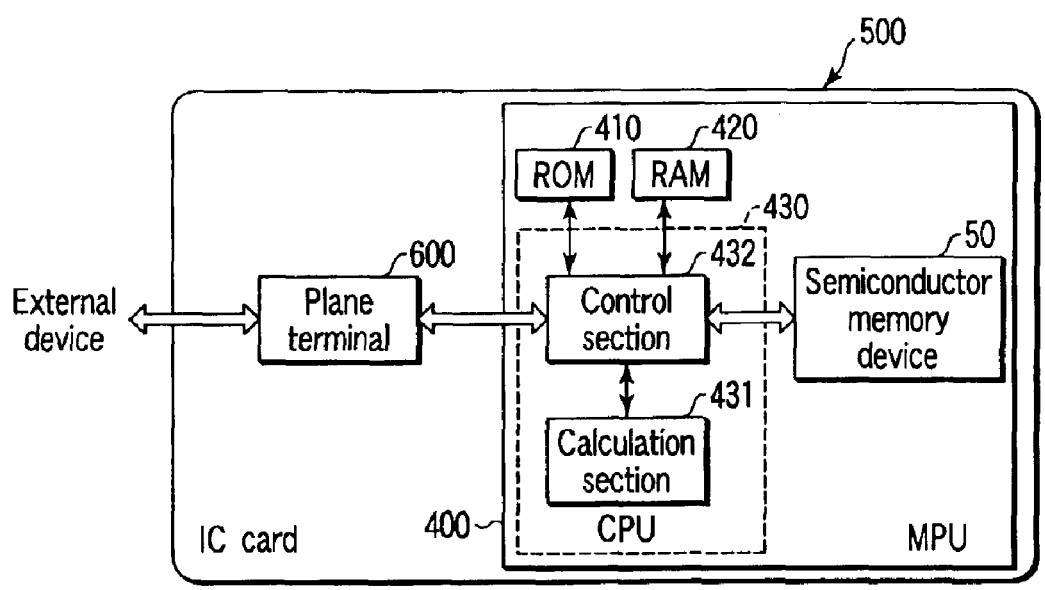
FIG. 20 is a block diagram of an IC card in accordance with an embodiment of the present invention.

Another exemplary implementation is shown in FIGS. 19 and 20. As shown in FIGS. 19 and 20, a semiconductor memory device 50 as described in connection with FIGS. 2A–13 and other circuits such as ROM (read only memory) 410, RAM (random access memory) 420 and CPU (central processing unit) 430 are included in an IC (interface circuit) card 500. The IC card 500 is connectable to an external device via a plane terminal 600 that is coupled to an MPU (micro-processing unit) portion 400 of the card 450. The CPU 430 contains a calculation section 431 and a control section 432, the control section 432 being coupled to the memory device 50, the ROM 410 and the RAM 420. Preferably, the MPU 400 is molded on one surface of the card 500 and the plane connecting terminal 600 is formed on the other surface.

Other implementations are readily discernable to one of ordinary skill in the art when the present description is read in view of the description in U.S. Pat. No. 6,002,605, which is incorporated herein by reference.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor memory device comprising:
   a first select transistor formed on an upper surface of a substrate and having a first multi-layer gate;
   a first stepped portion formed by etching the substrate adjacent to the first multi-layer gate of the first select transistor such that the first stepped portion forms a cavity in the upper surface of said substrate;
   a first contact plug formed in a region of the first stepped portion, the first contact plug being partially in contact with the first stepped portion; and
   a first insulating film formed between the first contact plug and the first multi-layer gate, the first insulating film being partially in contact with the first stepped portion.

2. The semiconductor memory, according to claim 1, further comprising,
   a second select transistor formed on the upper surface of the substrate and having a second multi-layer gate;
   a second stepped portion formed by etching the substrate adjacent to the second multi-layer gate of the second select transistor such that the second stepped portion forms a cavity in the upper surface of said substrate;
   a second contact plug formed in a region of the second stepped portion, the second contact plug being partially in contact with the second stepped portion; and
   a second insulating film formed between the second contact plug and the first multi-layer gate, the second inslating film being partially in contact with the second stepped portion.

3. The semiconductor memory, according to claim 1, wherein the semiconductor memory device is a NAND-type flash memory.

4. A semiconductor memory device comprising:
   a memory cell unit including at least one memory cell transistor, the memory cell transistor including:
   first and second semiconductor regions with a first conductivity which are formed apart from each other in a surface of a semiconductor layer with a second conductivity opposite to the first conductivity;
   a multi-layer gate electrode which is formed on the semiconductor layer between the first and second semiconductor regions with a first gate insulating film interposed therebetween, the multi-layer gate electrode including a charge accumulation layer and a control gate; and
   a first insulating film formed on the first and second semiconductor regions;
   a select transistor which selects the memory cell unit, the select transistor including:
   third and fourth semiconductor regions with the first conductivity which are formed apart from each other in a surface of the semiconductor layer,
   a first gate electrode which is formed on the semiconductor layer between the third and fourth semiconductor regions with a second gate insulating film interposed therebetween;
   a second insulating film formed on the third semiconductor region, an interface between the third semiconductor region and second insulating film being on a same plane as a plane of interfaces between the semiconductor layer and second gate insulating film;
   a third insulating film formed on the fourth semiconductor region, at least a part of the interface between the fourth semiconductor region and the third insulating film being positioned low to have a first stepped portion with respect to the interface between the semiconductor layer and the second gate insulating film;
   a first contact plug which is formed in a region of the first stepped portion, the first contact plug being partially in contact with the first stepped portion and being electrically connected to one of bit and source lines,
   a part of the third insulating film being partially in contact with the first stepped portion; and a memory cell array in which a plurality of memory cell units and select transistors are formed.

5. The semiconductor memory device according to claim 4, wherein interfaces between the semiconductor layer and first gate insulating film, between the first semiconductor region and first insulating film and between the second semiconductor layer and first insulating film are the same plane as a plane of the interface between the semiconductor layer and second gate insulating film.

6. The semiconductor memory device according to claim 4, wherein a height of the first stepped portion is larger than a thickness of the second gate insulating film.

7. The semiconductor memory device according to claim 4, wherein the first stepped portion is positioned outside an edge of the first gate electrode.

8. The semiconductor memory device according to claim 4, wherein the first and second gate insulating films are the same gate insulating films formed at the same time.

9. The semiconductor memory device according to claim 4, wherein the first contact plug is formed in a self-aligning manner with respect to the first gate electrode.

10. The semiconductor memory device according to claim 4, wherein the memory cell unit is a NAND cell unit in which a plurality of memory cell transistors is connected in series.

11. The semiconductor memory device according to claim 4, wherein a height of the first stepped portion is larger than a thickness of the second gate insulating film.

12. The semiconductor memory device according to claim 4, wherein the first stepped portion is positioned outside an edge of the first gate electrode.

13. The semiconductor memory device according to claim 4, wherein the charge accumulation layer transmits/receives electrons with at least one of the first, second and third semiconductor layer via the first gate insulating film to write data.

14. A semiconductor memory device comprising:
   a memory cell transistor including first source/drain regions formed in the surface of a semiconductor substrate, and a multi-layer gate electrode which is formed on the semiconductor substrate between the first source/drain regions and which includes a charge accumulation layer and control gate; and
   a select transistor including second source/drain regions which are formed in the surface of the semiconductor substrate and a gate electrode formed on the semiconductor substrate between the second source/drain regions;
   an insulating film formed on the second source/drain region, at least a part of the interface between the source/drain region and the insulating film being positioned low to have a stepped portion with respect to the interface between the semiconductor substrate and the gate insulating film; and
   a contact plug formed in a region of the stepped region, the contact plug being partially in contact with the stepped region,
   a part of the insulating film being partially in contact with the stepped portion.

* * * * *

UNITED STATES PATENT AND TRADEMARK OFFICE
CERTIFICATE OF CORRECTION

PATENT NO.       : 6,995,414 B2                                              Page 1 of 1
APPLICATION NO.  : 10/294049
DATED            : February 7, 2006
INVENTOR(S)      : Toshitake Yaegashi It is certified that error appears in the above-identified patent and that said Letters Patent is hereby corrected as shown below:

Column 22, line 7 (Claim 5):    change "layer" to --region--

Signed and Sealed this

Seventh Day of November, 2006

JON W. DUDAS
*Director of the United States Patent and Trademark Office*